(12) United States Patent
Lee et al.

(10) Patent No.: US 12,490,631 B2
(45) Date of Patent: Dec. 2, 2025

(54) LIGHT EMITTING DISPLAY DEVICE

(71) Applicant: LG Display Co., Ltd., Seoul (KR)

(72) Inventors: SangHoon Lee, Paju-si (KR); HanSol Choi, Paju-si (KR); Joonsuk Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 470 days.

(21) Appl. No.: 17/991,439

(22) Filed: Nov. 21, 2022

(65) Prior Publication Data

US 2023/0207734 A1 Jun. 29, 2023

(30) Foreign Application Priority Data

Dec. 28, 2021 (KR) .................. 10-2021-0189823
Jun. 8, 2022 (KR) .................. 10-2022-0069406

(51) Int. Cl.
*H10K 59/131* (2023.01)
*H10H 20/857* (2025.01)
*H10H 29/49* (2025.01)
*H10K 59/122* (2023.01)
(Continued)

(52) U.S. Cl.
CPC ..... *H10K 59/80522* (2023.02); *H10H 20/857* (2025.01); *H10K 59/122* (2023.02); *H10K 59/124* (2023.02); *H10K 59/1315* (2023.02); *H10H 29/49* (2025.01)

(58) Field of Classification Search
CPC ...... H10K 59/12; H10K 59/131; H10K 59/82; H10K 59/1315; H10K 59/80522; H10K 59/124; H10K 59/122; H10K 59/173; H10K 50/824; H10H 20/0364; H10H 20/857; H10H 29/0364; H10H 29/49; H10H 29/857; H10H 29/41; H10H 29/37
See application file for complete search history.

(56) References Cited

U.S. PATENT DOCUMENTS

2015/0060822 A1* 3/2015 Kamiya ............... H10K 59/122
257/40
2018/0190934 A1* 7/2018 Choi ................ H10K 59/80522
2019/0115403 A1   4/2019 Kang
(Continued)

FOREIGN PATENT DOCUMENTS

KR          20090020622 A * 2/2009 ............ H10K 71/60
KR    10-2016-0127459 A   11/2016
(Continued)

OTHER PUBLICATIONS

Intellectual Property Office of the United Kingdom, Search and Examination Report, United Kingdom Patent Application No. GB2217360.3, Jun. 1, 2023, nine pages.

*Primary Examiner* — Yu Chen
(74) *Attorney, Agent, or Firm* — LG Display Co., Ltd.

(57) ABSTRACT

A light emitting display device includes a circuit layer having an auxiliary power electrode disposed on a substrate, a first protective layer covering the circuit layer, a second protective layer disposed between the first protective layer and the auxiliary power electrode, a contact portion penetrating the first protective layer and the second protective layer to expose a portion of the auxiliary power electrode, and a step cover pattern disposed in a step coverage region between the first protective layer and the second protective layer in the periphery of the contact portion.

21 Claims, 19 Drawing Sheets

(51) Int. Cl.
*H10K 59/124* (2023.01)
*H10K 59/80* (2023.01)

(56) References Cited

U.S. PATENT DOCUMENTS

| | | | |
|---|---|---|---|
| 2019/0207168 A1 | 7/2019 | Lee et al. | |
| 2020/0135838 A1 | 4/2020 | Han et al. | |
| 2023/0217795 A1* | 7/2023 | Lee | H10K 59/8722 |
| | | | 257/40 |

FOREIGN PATENT DOCUMENTS

| | | | | |
|---|---|---|---|---|
| KR | 10-2017-0124070 A | 11/2017 | | |
| KR | 10-2021-0068831 A | 6/2021 | | |
| KR | 102746590 B1 * | 12/2024 | | H10K 59/80522 |
| WO | WO 2020/206721 A1 | 10/2020 | | |

* cited by examiner

LIGHT EMITTING DISPLAY DEVICE

CROSS-REFERENCE TO RELATED APPLICATIONS

This application claims priority to Republic of Korea patent application no. 10-2021-0189823, filed Dec. 28, 2021, and Republic of Korea patent application no. 10-2022-0069406, filed on Jun. 8, 2022, all of which are incorporated herein by reference in their entirety.

BACKGROUND

Technical Field

The present disclosure relates to a light emitting display device.

Description of the Related Art

With the advancement of an information-oriented society, attentions and requirements for a display device configured to display image have been increased in various types. Accordingly, a display device such as a Liquid Crystal Display (LCD), an organic light emitting display (OLED), a Micro Light Emitting Diode (Micro LED), a quantum dot display device (QD), or the like is utilized.

Among these display devices, the light emitting display device is classified into an inorganic light emitting display device and an organic light emitting display device depending on a material of a light emitting layer. For example, the organic light emitting display device is self-luminous, wherein holes and electrons are injected into an emission layer from an anode electrode for a hole injection and a cathode electrode for an electron injection, and light is emitted when excitons in which the injected holes and electrons are combined fall from an excited state to a ground state, to thereby display an image.

The light emitting display device may be divided into a top emission type, a bottom emission type, or a dual emission type according to a direction in which light is emitted.

In case of the light emitting display device of the top emission type, a transparent electrode or a semi-transmissive electrode may be used as a cathode to emit light from the light emitting layer to an upper portion. The cathode electrode has a thin profile (or thickness) to improve transmittance, thereby increasing an electrical resistance. Particularly, in case of the large-sized light emitting display device, a voltage drop may be more severely generated according as a distance from a voltage supplying pad increases, whereby a luminance non-uniformity problem of the light emitting display device might occur.

In order to overcome the problem of voltage drop caused by the increase in resistance of the cathode electrode, a cathode contact structure having an undercut shape is proposed to electrically connect a separate auxiliary electrode to the cathode electrode.

The above content of the background technology may be retained for a deduction of the present disclosure by inventors or may be technology information learned by practice of embodiments of the present disclosure. However, the above content of the background technology may be not a prior art published to the general public before an application of the present disclosure.

SUMMARY

However, the cathode contact structure may have a step coverage at the interface between different material layers provided to form a contact area, and a separation phenomenon may occur in the undercut structure due to a lowered adhesion. In order to prevent the separation of undercut structure, a dummy electrode may be disposed between the different material layers. However, a metal foreign material may exist in the contact area for a process of patterning the dummy electrode, and thus the coverage characteristics of the material to be deposited in following steps may be deteriorated.

Also, in order to prevent the separation of undercut structure, an undercut structure is implemented by using an overcoat layer and a passivation layer having the relatively excellent adhesion characteristics. For a process of patterning the undercut structure, a phenomenon in which an edge portion in a pattern of the overcoat layer is lifted occurs, thereby increasing a time for patterning the undercut structure and an etching area of the undercut structure.

The present disclosure has been made in view of the above problems, and it is an object of the present disclosure to provide a light emitting display device capable of preventing defects caused by foreign matters from being diffused by covering metal foreign matters in the periphery of contact area in a cathode contact structure.

It is another object of the present disclosure to provide a light emitting display device capable of reducing a step coverage between different material layers in the periphery of contact area in a cathode contact structure.

It is another object of the present disclosure to provide a light emitting display device capable of reducing the time and etching area for patterning an undercut structure in a cathode contact structure.

In accordance with an aspect of the present disclosure, the above and other objects can be accomplished by the provision of a light emitting display device comprising a circuit layer having an auxiliary power electrode disposed on a substrate, a first protective layer covering the circuit layer, a second protective layer disposed between the first protective layer and the auxiliary power electrode, a contact portion penetrating the first protective layer and the second protective layer to expose a portion of the auxiliary power electrode, and a step cover pattern disposed in a step coverage region between the first protective layer and the second protective layer in the periphery of the contact portion.

In accordance with another aspect of the present disclosure, there is provided a light emitting display device comprising a circuit layer having a thin film transistor and an auxiliary power electrode disposed on a substrate, a first protective layer covering the circuit layer, a second protective layer disposed between the first protective layer and the auxiliary power electrode, a pixel electrode disposed on the first protective layer and connected to the thin film transistor, a bank layer disposed on the first protective layer and configured to define an opening on the pixel electrode, a contact portion passing through the first and second protective layers and the bank layer to expose a portion of the auxiliary power electrode, a light emitting layer disposed on the pixel electrode and the bank layer, a common electrode disposed on the light emitting layer and connected to the auxiliary power electrode in the contact portion, and a step cover pattern disposed in a step coverage region between the first protective layer and the second protective layer in the periphery of the contact portion.

In accordance with another aspect of the present disclosure, there is provided a light emitting display device comprising a circuit layer having an auxiliary power electrode disposed on a substrate, a first protective layer covering the circuit layer, a second protective layer disposed between the first protective layer and the auxiliary power electrode, a contact portion penetrating the first protective layer and the second protective layer to expose a portion of the auxiliary power electrode, an eaves structure disposed on a portion of the auxiliary power electrode; and an extension cover pattern on a side surface of the eaves structure.

In accordance with another aspect of the present disclosure, there is provided a light emitting display device including at least one subpixel on the substrate, the subpixel including a light emitting element, an auxiliary power electrode disposed on the substrate, the auxiliary power electrode electrically connected to a common electrode of the light emitting element, a first protective layer on the substrate, a second protective layer disposed between the first protective layer and the auxiliary power electrode, wherein one or more openings are formed through the first protective layer and the second protective layer to expose at least a portion of the auxiliary power electrode to form a contact portion, a structure disposed on the exposed portion of the auxiliary power electrode, and a cover pattern disposed in a coverage region in the contact portion, wherein the coverage region is located where an upper surface of the second protective layer and a side surface of the first protective layer intersect in the contact portion.

In accordance with another aspect of the present disclosure, there is provided a light emitting display device including at least one subpixel on the substrate, the subpixel including a light emitting element, an auxiliary power electrode disposed on the substrate, the auxiliary power electrode electrically connected to a common electrode of the light emitting element, a first protective layer on the substrate, a second protective layer disposed between the first protective layer and the auxiliary power electrode, wherein one or more openings are formed through the first protective layer and the second protective layer to expose at least a portion of the auxiliary power electrode to form a contact portion, a structure disposed on the exposed portion of the auxiliary power electrode, and an extension cover pattern on a side surface of the structure.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings.

DETAILED DESCRIPTION

Figure 1:
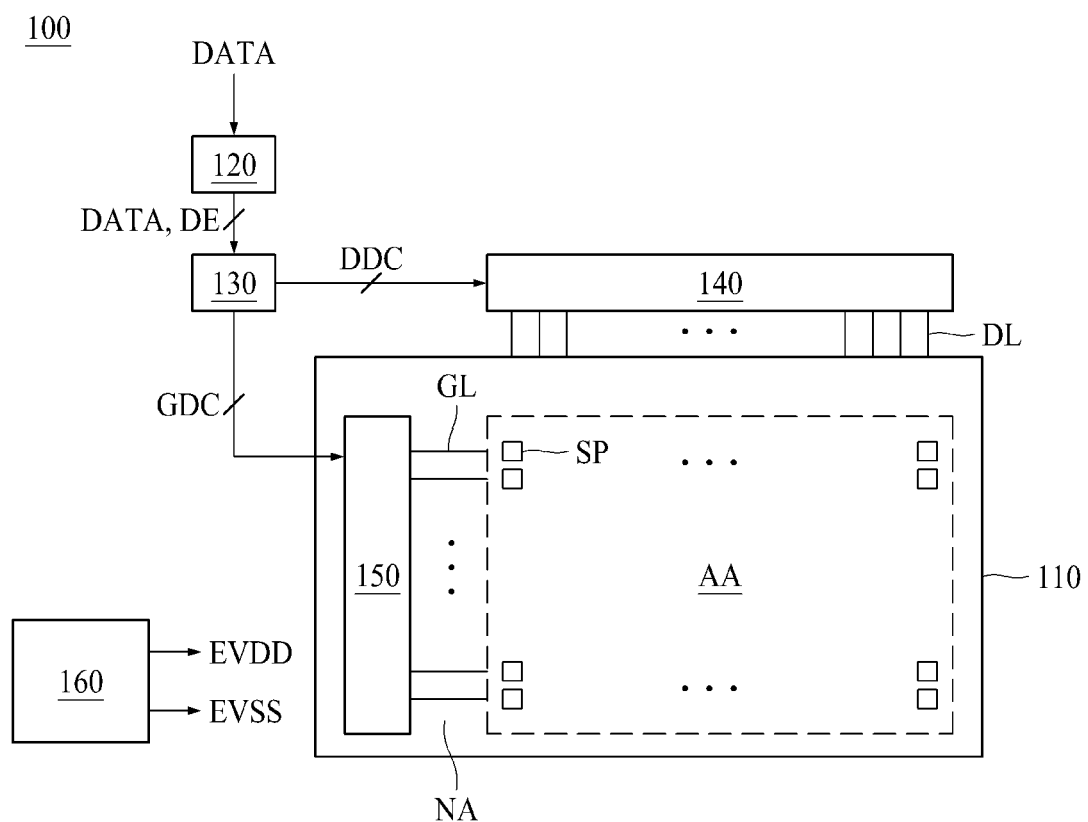
FIG. 1 is a plan view schematically illustrating a light emitting display device according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a preferred embodiment of a light emitting display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a block diagram schematically illustrating a light emitting display device according to one embodiment of the present disclosure.

Referring to FIG. 1, the light emitting display device 100 according to one embodiment of the present disclosure may include a display panel 110, an image processor 120, a timing controller 130, a data driver 140, a scan driver 150, and a power supply 160.

The display panel 110 may display an image corresponding to a data signal DATA supplied from the data driver 140, a scan signal supplied from the scan driver 150, and power supplied from the power supply 160.

The display panel 110 may include a sub pixel SP disposed at every intersection of a plurality of gate lines GL and a plurality of data lines DL. A structure of the sub pixel SP may vary depending on the type of the display device 100.

For example, the sub pixels SP may be formed in a top emission method, a bottom emission method, or a dual emission method according to the structure. The sub pixels SP may include a red sub pixel, a green sub pixel, and a blue sub pixel. Alternatively, the sub pixel SP may include a red sub pixel, a blue sub pixel, a white sub pixel, and a green sub pixel. The sub pixels SP may have one or more other light emitting areas according to light emitting characteristics.

The one or more sub pixels SP may constitute one unit pixel. For example, one unit pixel may include red, green, and blue sub pixels, and the red, green, and blue sub pixels may be repeatedly arranged. Alternatively, one unit pixel may include red, green, blue, and white subpixels, wherein the red, green, blue and white subpixels may be repeatedly arranged, or the red, green, blue and white subpixels may be arranged in a quad type. In the embodiment according to the present disclosure, the color type, arrangement type, arrangement order, etc. of the sub pixels may be configured in various forms depending on the luminous characteristics, the lifespan of the device, the spec of the device, and the like, whereby it is not limited thereto.

The display panel 110 may be divided into a display area AA for displaying an image by arranging the sub pixels SP, and a non-display area NA around the display area AA. The scan driver 150 may be provided on the non-display area NA of the display panel 110. In addition, the non-display area NA may include a pad area.

The image processor 120 may output a data enable signal DE together with the data signal DATA supplied from the outside. The image processor 120 may output one or more of a vertical synchronization signal, a horizontal synchronization signal, and a clock signal in addition to the data enable signal DE.

The timing controller 130 may receive the data signal DATA as well as a driving signal from the image processor 120. The driving signal may include the data enable signal DE. Alternatively, the driving signal may include a vertical synchronization signal, a horizontal synchronization signal, and a clock signal. The timing controller 130 may output a data timing control signal DDC for controlling the operation timing of the data driver 140, and a gate timing control signal GDC for controlling the operation timing of the scan driver 150 based on the driving signal.

The data driver 140 may convert the data signal DATA into a gamma reference voltage by sampling and latching the data signal DATA supplied from the timing controller 130 in response to the data timing control signal DDC supplied from the timing controller 130, and may output the gamma reference voltage.

The data driver 140 may output the data signal DATA through the data lines DL. The data driver 140 may be implemented in the form of an integrated circuit IC. For example, the data driver 140 may be electrically connected to the pad area disposed in the non-display area NA of the display panel 110 through a flexible circuit film.

The scan driver 150 may output the scan signal in response to the gate timing control signal GDC supplied from the timing controller 130. The scan driver 150 may output the scan signal through the gate lines GL. The scan driver 150 may be implemented in the form of an integrated circuit IC or may be implemented in a gate-in-panel GIP scheme.

The power supply portion 160 may output a high potential voltage and a low potential voltage for driving the display panel 110. The power supply portion 160 may supply the high potential voltage to the display panel 110 through a first power line EVDD (driving power line or pixel power line), and may supply the low potential voltage to the display panel 110 through a second power line EVSS (auxiliary power line or common power line).

Figure 2:
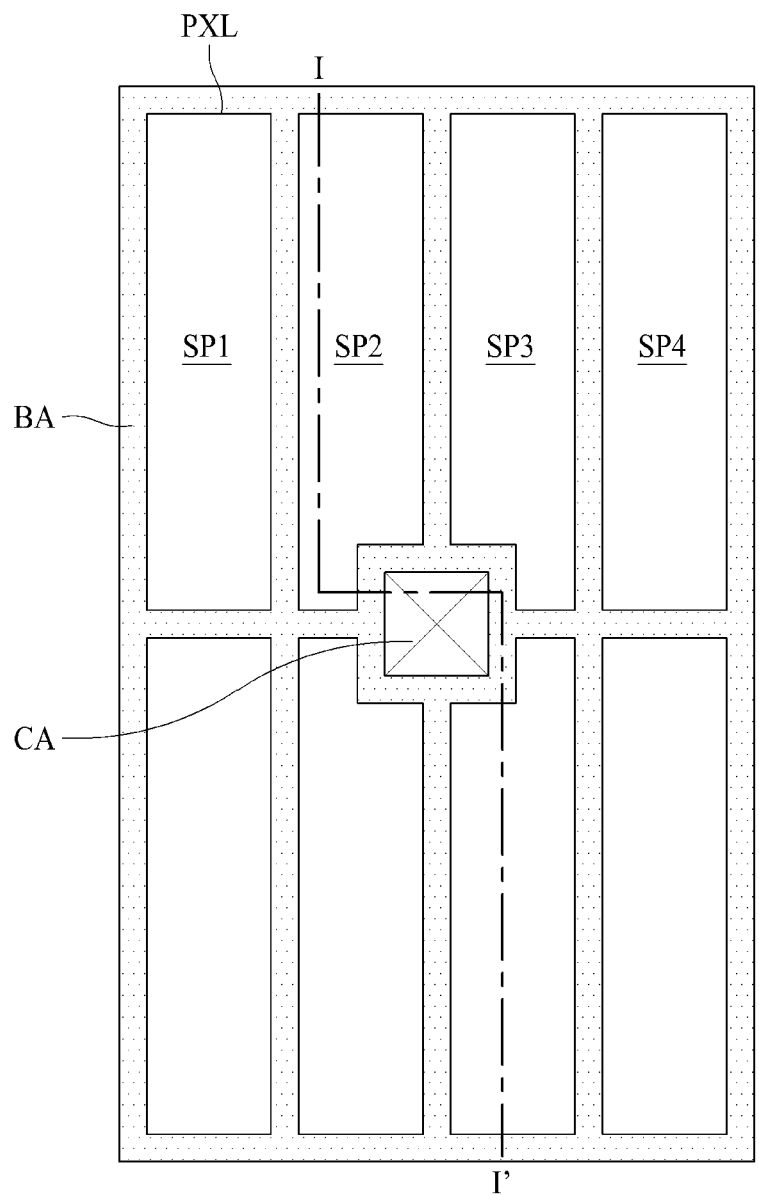
FIG. 2 schematically illustrates a first electrode, a bank, and a contact portion of subpixels in the light emitting display device according to an embodiment of the present disclosure.

FIG. 2 is a plan view schematically illustrating a first electrode, a bank layer, and a contact portion of sub pixels in the light emitting display device according to the embodiment of the present disclosure.

Referring to FIG. 2 in connection with FIG. 1, the display panel 110 of the light emitting display device 100 according to the embodiment of the present disclosure may be divided into the display area AA and the non-display area NA, and may include the plurality of sub pixels SP1, SP2, SP3, and SP4 defined by the intersection between the gate line GL and the data line DL on the substrate of the display area AA.

As shown in FIG. 2, the plurality of sub pixels SP1, SP2, SP3, and SP4 may include the first sub pixel SP1, the second sub pixel SP2, the third sub pixel SP3, and the fourth sub pixel SP4. For example, the first sub pixel SP1 may emit red light, the second sub pixel SP2 may emit green light, the third sub pixel SP3 may emit blue light, and the fourth sub pixel SP4 may emit white light, but not necessarily. It is possible to omit the fourth sub pixel SP4 for emitting white light. It is possible to configure the sub pixels emitting at least two of red light, green light, blue light, yellow light, magenta light, and cyan light. Also, the arrangement order of the sub pixels SP1, SP2, SP3, and SP4 may be variously changed.

A pixel electrode PXL (or anode electrode or first electrode) may be disposed in each of the plurality of sub pixels SP1, SP2, SP3, and SP4. A bank layer BA covering (or overlaying) an edge portion of the pixel electrode PXL and defining an opening corresponding to the plurality of sub pixels SP1, SP2, SP3, and SP4 may be disposed on the pixel electrode PXL. Then, a light emitting layer (or organic light emitting layer) and a common electrode (or cathode electrode or second electrode) may be sequentially stacked on the pixel electrode PXL and the bank layer BA.

According to the embodiment of the present disclosure, in order to lower the resistance of the common electrode provided over the entire surface of the display panel 110, a separate auxiliary power electrode may be formed of a material having a lower resistance than the common electrode and electrically connected to the common electrode. The bank layer BA may define a contact portion CA that exposes a portion of the auxiliary power electrode so as to electrically connect the auxiliary power electrode and the common electrode with each other.

The contact portion CA may be formed for each of the four sub pixels SP1, SP2, SP3, and SP4 constituting one unit pixel while being parallel to the gate line GL, however, it is not limited to this structure. The contact portion CA may be formed every several sub pixels. In addition, the contact portion CA may be formed by each horizontal line in a direction parallel to the data line DL, but is not limited thereto, and may be formed every several horizontal lines.

Figure 3:
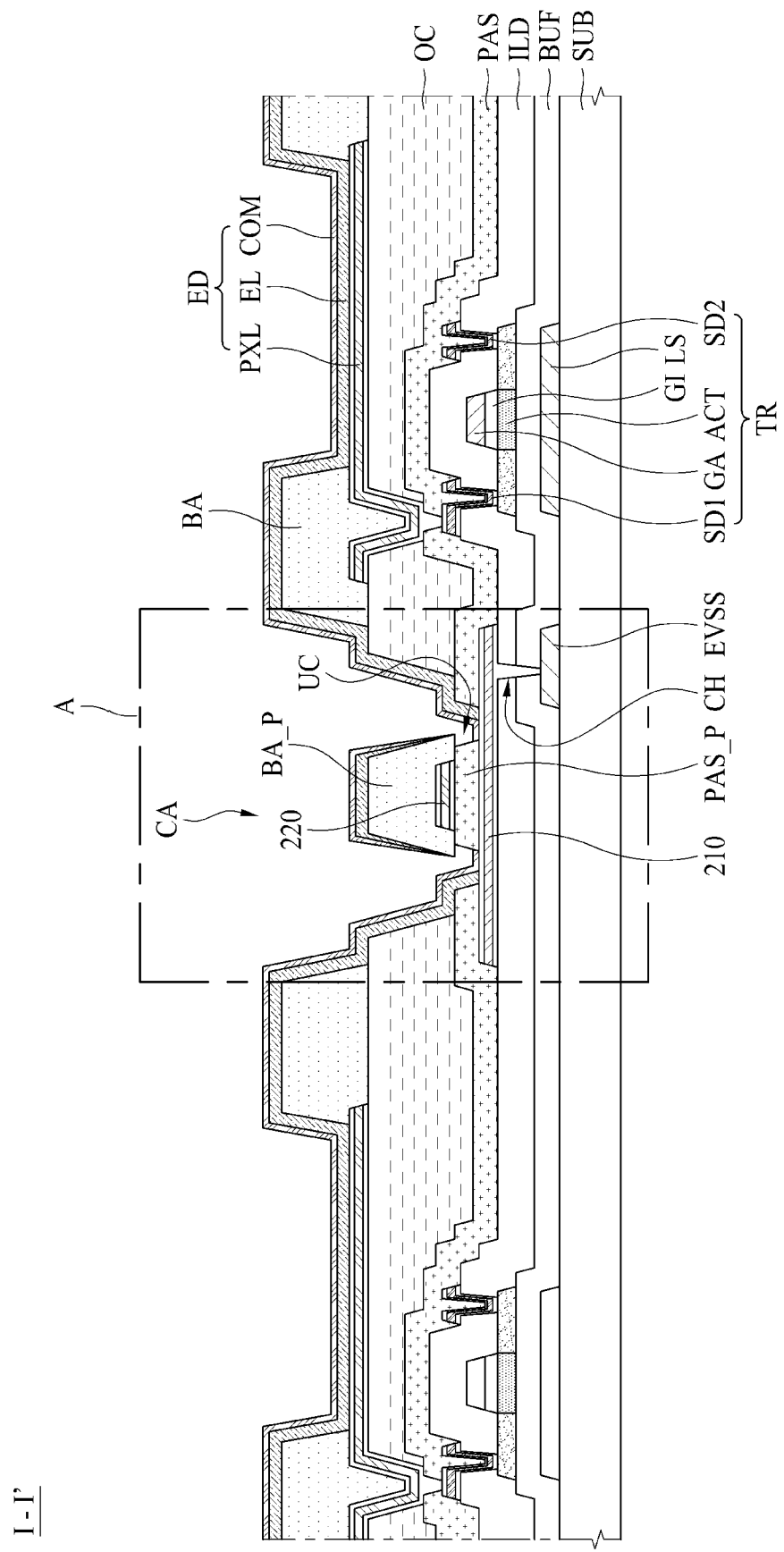
FIG. 3 is a cross sectional view illustrating the light emitting display device according to one embodiment of the present disclosure along I-I' of FIG. 2.

FIG. 3 is a cross sectional view illustrating the light emitting display device according to one embodiment of the present disclosure along I-I' of FIG. 2.

Referring to FIG. 3, the light emitting display device 100 according to one embodiment of the present disclosure may include a substrate SUB, a light shielding layer LS, an auxiliary power line EVSS (second power line or common power line), a buffer layer BUF, a thin film transistor TR, a storage capacitor, a gate insulating film GI, an interlayer insulating film ILD, an auxiliary power electrode 210, a passivation layer PAS (or second protective layer), an overcoat layer OC (first protective layer or planarization layer), a light emitting element ED, a bank layer BA, a contact portion CA, and an undercut structure BA_P and PAS_P.

The substrate SUB is a base substrate and may be formed of a glass or plastic material. For example, the substrate SUB may be formed of a plastic material such as polyimide PI, polyethylene terephthalate PET, polyethylene naphthalate PEN, and polycarbonate PC, and may have the flexible characteristic.

A circuit element including various signal lines, a thin film transistor TR, a storage capacitor, and the like may be formed for each of the plurality of subpixels SP1, SP2, SP3, and SP4. The signal lines may include a gate line GL, a data line DL, a first power line EVDD (driving power line or pixel power line), a second power line EVSS (auxiliary power line or common power line), a reference line, and the like, and the thin film transistor TR may include a driving thin film transistor, a switching thin film transistor, a sensing thin film transistor, and the like.

The light shielding layer LS and the auxiliary power line EVSS (second power line or common power line) may be disposed on the substrate SUB. The light shielding layer LS may be disposed to overlap the thin film transistor TR. For example, the light shielding layer LS may overlap an active layer ACT of the thin film transistor TR, and more particularly, a channel region of the active layer ACT on a plane. The light shielding layer LS may serve to block external light from entering the active layer ACT. In addition, the auxiliary power line EVSS (second power line or common power line) may serve to apply a low voltage to a common electrode COM (cathode electrode or second electrode). Also, the auxiliary power line EVSS together with the auxiliary power electrode 210 may serve to lower a resistance of the common electrode COM.

The light shielding layer LS and the auxiliary power line EVSS may be provided in the same layer and may be formed of the same material. In this case, the light shielding layer LS and the auxiliary power line EVSS may be simultaneously formed through the same process.

A buffer layer BUF may be disposed on the substrate SUB and may be configured to cover the light shielding layer LS and the auxiliary power line EVS S. The buffer layer BUF may be formed in a single-layered structure or a multi-layered structure by stacking a plurality of inorganic films. For example, the buffer layer BUF may be formed of a single layer formed of a silicon oxide film SiOx, a silicon nitride film SiNx, and a silicon oxynitride film SiOxNy. Alternatively, the buffer layer BUF may be formed of a multilayer in which at least two films of a silicon oxide film SiOx, a silicon nitride film SiNx, and a silicon oxynitride film SiOxNy are stacked. The buffer layer BUF may be formed on the entire upper surface of the substrate SUB to block ions or impurities diffused from the substrate SUB, and to block moisture penetrating into the light emitting element ED through the substrate SUB.

The thin film transistor TR, the storage capacitor, and the auxiliary power electrode 210 may be disposed on the buffer layer BUF. The thin film transistor TR may be disposed in each of the plurality of subpixels SP1, SP2, SP3, and SP4 on the buffer layer BUF. For example, the thin film transistor TR may include an active layer ACT, a gate electrode GA which overlaps the active layer ACT with the gate insulating film GI interposed therebetween, a first source/drain electrode SD1, and a second source/drain electrode SD2. In addition, the storage capacitor may be formed in a three-layered structure by overlapping a first capacitor electrode which uses a portion or the whole of the light shielding layer LS or auxiliary power line EVSS, a second capacitor electrode which is patterned with the same metal material as the gate electrode GA of the thin film transistor TR, and a third capacitor electrode which uses a portion or the whole of the auxiliary power electrode 210, but not necessarily limited thereto. If needed, the storage capacitor may be formed of a plurality of layers in various ways. In addition, the auxiliary power electrode 210 may be electrically connected to the auxiliary power line EVSS through a contact hole CH passing through the buffer layer BUF and the interlayer insulating film ILD.

The active layer ACT of the thin film transistor TR may be formed of a silicon-based or oxide-based semiconductor material and may be provided on the buffer layer BUF. The active layer ACT may include a channel region overlapped with the gate electrode GA and a source/drain region connected to the first and second source/drain electrodes SD1 and SD2.

The gate insulating film GI may be formed on the active layer ACT. The gate insulating film GI may be disposed on the channel region of the active layer ACT, and may insulate the active layer ACT and the gate electrode GA. The gate insulating film GI may be formed of an inorganic insulating material, for example, a silicon oxide film SiOx, a silicon nitride film SiNx, a silicon oxynitride film SiOxNy, or a multilayer thereof.

The gate electrode GA may be formed on the gate insulating film GI. The gate electrode GA may be disposed to face the active layer ACT with the gate insulating film GI interposed therebetween. The gate electrode GA may be formed of a single layer or multiple layers selected from a group consisting of copper Cu, molybdenum Mo, aluminum Al, chromium Cr, gold Au, titanium Ti, nickel Ni, neodymium Nd, tantalum Ta, or tungsten W, or an alloy thereof. In addition, the second capacitor electrode included in the storage capacitor may be formed of the same material as the gate electrode GA. In this case, the gate electrode GA of the thin film transistor TR and the second capacitor electrode of the storage capacitor may be simultaneously formed through the same process.

The interlayer insulating film ILD covering the gate electrode GA may be formed on the buffer layer BUF. Also, the interlayer insulating film ILD may be formed to cover the second capacitor electrode of the storage capacitor. The interlayer insulating film ILD may serve to protect the thin film transistor TR. The interlayer insulating film ILD may be formed of an inorganic insulating material. For example, the interlayer insulating film ILD may be formed of a silicon oxide film SiOx, a silicon nitride film SiNx, a silicon oxynitride layer SiOxNy, or a multilayer thereof.

The first and second source/drain electrodes SD1 and SD2 may be formed on the interlayer insulating film ILD. The interlayer insulating film ILD may be removed to contact the active layer ACT and the first and second source/drain electrodes SD1 and SD2. For example, the first and second source/drain electrodes SD1 and SD2 may be electrically connected to the active layer ACT through a contact hole passing through the interlayer insulating film ILD.

The auxiliary power electrode 210 may be formed on the interlayer insulating film ILD. A corresponding portion in each of the interlayer insulating film ILD and the buffer layer BUF therebelow may be removed to contact the auxiliary power line EVSS and the auxiliary power electrode 210. For example, the auxiliary power electrode 210 may be electrically connected to the auxiliary power line EVSS through a contact hole CH passing through the interlayer insulating film ILD and the buffer layer BUF. In addition, the auxiliary power electrode 210 may serve as the third capacitor electrode of the storage capacitor.

The first and second source/drain electrodes SD1 and SD2 and the auxiliary power electrode 210 may be provided in the same layer and may be formed of the same material. The first and second source/drain electrodes SD1 and SD2 and the auxiliary power electrode 210 may be simultaneously formed through the same process. The first and second source/drain electrodes SD1 and SD2 and the auxiliary power electrode 210 may be formed as a single layer or multiple layers. When each of the first and second source/drain electrodes SD1 and SD2 and the auxiliary power electrode 210 is formed of a single layer, the first and second source/drain electrodes SD1 and SD2 and the auxiliary power electrode 210 may be formed of any one selected from the group consisting molybdenum Mo, aluminum Al, chromium Cr, gold Au, titanium Ti, nickel Ni, neodymium Nd, copper Cu or an alloy thereof. Also, when each of the first and second source/drain electrodes SD1 and SD2 and the auxiliary power electrode 210 is formed of the multi-layers, the first and second source/drain electrodes SD1 and SD2 and the auxiliary power electrode 210 may be double layers of molybdenum/aluminum-neodymium, molybdenum/aluminum, titanium/aluminum, or copper/molybdenum titanium. Alternatively, the first and second source/drain electrodes SD1 and SD2 and the auxiliary power electrode 210 may be formed of three layers of molybdenum/aluminum-neodymium/molybdenum, molybdenum/aluminum/molybdenum, titanium/aluminum/titanium, or molybdenum titanium/copper/molybdenum titanium, but not limited thereto. The first and second source/drain electrodes SD1 and SD2 and the auxiliary power electrode 210 may be formed of multiple layers of any one selected from the group consisting molybdenum Mo, aluminum Al, chromium Cr, gold Au, titanium Ti, nickel Ni, neodymium Nd, copper Cu or an alloy thereof.

The thin film transistor TR, the storage capacitor and the auxiliary power electrode 210 disposed on the substrate SUB may constitute a circuit layer (or thin film transistor array layer).

The passivation layer PAS (or second protective layer) may be disposed on the thin film transistor TR and the auxiliary power electrode 210. The passivation layer PAS may be formed to cover the thin film transistor TR and the auxiliary power electrode 210. The passivation layer PAS protects the thin film transistor TR and may be formed of an inorganic insulating material. For example, the passivation layer PAS may include a silicon oxide layer SiOx, a silicon nitride layer SiNx, a silicon oxynitride layer SiOxNy, or may be formed of a multilayer thereof.

An overcoat layer OC (first protective layer or planarization layer) may be disposed on the passivation layer PAS (or second protective layer). The overcoat layer OC may be formed of an organic insulating material to planarize a step coverage in a lower portion of the overcoat layer OC. For example, the overcoat layer OC may include at least one of organic materials such as photo acryl, polyimide, benzocyclobutene resin, and acrylate-based resin.

A pixel electrode PXL (anode electrode or first electrode) may be disposed on the overcoat layer OC (first protective layer or planarization layer). The pixel electrode PXL may be disposed in each of the plurality of subpixels SP1, SP2, SP3, and SP4 on the overcoat layer OC. The pixel electrode PXL may be connected to the first source/drain electrode SD1 of the thin film transistor TR through a contact hole passing through the overcoat layer OC and the passivation layer PAS. Alternatively, the pixel electrode PXL may be connected to the second source/drain electrode SD2 of the thin film transistor TR. The light emitting layer EL and the common electrode COM may be disposed on the pixel electrode PXL. The pixel electrode PXL, the light emitting layer EL, and the common electrode COM may constitute the light emitting element ED.

The pixel electrode PXL (anode electrode or first electrode) may be formed of metal, an alloy thereof, and a combined material of metal and oxide metal. For example, the pixel electrode PXL may have a multi-layered structure including a transparent conductive film and an opaque conductive film having high reflection efficiency. The transparent conductive film of the pixel electrode PXL may be formed of a material having a relatively high work function value such as Indium Tin Oxide ITO or Indium Zinc Oxide IZO, and the opaque conductive film may include one or multiple layers selected from the group consisting of silver Ag, aluminum Al, copper Cu, molybdenum Mo, titanium Ti, nickel Ni, chromium Cr, or tungsten W. For example, the pixel electrode PXL may have a structure in which a transparent conductive film, an opaque conductive film, and a transparent conductive film are sequentially stacked, or a structure in which a transparent conductive film and an opaque conductive film are sequentially stacked.

A bank layer BA may be disposed on the pixel electrode PXL and the overcoat layer OC. The bank layer BA may cover the edge portion of the pixel electrode PXL and define an opening of the subpixel. The bank layer BA may be formed of an organic material such as polyimide, acrylate, benzocyclobutene series resin, or the like. A central portion of the pixel electrode PXL exposed by the bank layer BA may be defined as an emission area. Also, the bank layer BA may define the contact portion CA which exposes a portion of the auxiliary power electrode 210 so that the auxiliary power electrode 210 and the common electrode COM are electrically connected to each other.

The contact portion CA may pass through the passivation layer PAS, the overcoat layer OC, and the bank layer CA, to thereby expose a portion of the auxiliary power electrode 210. An undercut structure BA_P and PAS_P having an undercut region UC may be disposed on the auxiliary power electrode 210 exposed by the contact portion CA. For example, one or more openings may be formed through the bank layer BA, the overcoat layer OC, and the passivation layer PAS to expose at least a portion of the auxiliary power electrode 210 and form the contact portion CA.

The undercut structure BA_P and PAS_P may be disposed on a portion of the auxiliary power electrode 210 and may include the undercut region UC. The undercut structure BA_P and PAS_P may be formed in an island pattern on a portion of the auxiliary power electrode 210, and the auxiliary power electrode 210 may be exposed in the periphery of the undercut structure BA_P and PAS_P. The auxiliary power electrode 210, which is exposed in the periphery of the undercut structure BA_P and PAS_P in the contact portion CA, may be in contact with the common electrode COM (cathode electrode or second electrode) and may be electrically connected thereto. The undercut structures BA_P and PAS_P may be formed of the same material as the passivation layer PAS and the bank layer BA. The undercut structure BA_P and PAS_P may include a first pattern BA_P (or eaves structure) formed the same material as the bank layer BA and a second pattern PAS_P (or pillar structure) formed of the same material as the passivation layer PAS. A dummy electrode pattern 220 may be disposed between the first pattern BA_P and the second pattern PAS_P. The dummy electrode pattern 220 may be disposed between the first pattern BA_P and the second pattern PAS_P, to thereby enhance adhesion between the first pattern BA_P formed of the same material as the bank layer BA and the second pattern PAS_P formed of the same material as the passivation layer PAS. Thus, it is possible to prevent the first pattern BA_P from being lifted and separated from the second pattern PAS_P. The dummy electrode pattern 220 may be formed of the same material as the pixel electrode PXL through the same process. The dummy electrode pattern 220 may be disposed on the second pattern PAS_P, and the first pattern BA_P may be disposed to cover the dummy electrode pattern 220. For example, the dummy electrode pattern 220 may be completely covered by the first pattern BA_P and the second pattern PAS_P and may not be exposed in the undercut region UC, but not limited thereto. A portion of the dummy electrode pattern 220 may be partially exposed in the undercut region UC.

The light emitting layer EL may be disposed on the pixel electrode PXL and the bank layer BA. The light emitting layer EL may be disposed on the overcoat layer OC. Also, the light emitting layer EL may be disposed on the first pattern BA_P of the undercut structure. The light emitting layer EL may be disposed on the auxiliary power electrode 210 exposed through the contact portion CA. The light emitting layer EL may be disconnectedly provided in the undercut region UC by the undercut structure positioned in the contact portion CA. For example, the light emitting layer EL may be formed of a material having inferior step coverage. Accordingly, the light emitting layer EL may have the minimized area or reduced area disposed on the auxiliary power electrode 210 owing to the undercut structure BA_P and PAS_P, and the light emitting layer EL is disconnectedly provided in the undercut region UC, whereby the auxiliary power electrode 210 disposed thereunder is exposed.

The common electrode COM (cathode electrode or second electrode) may be disposed on the light emitting layer EL. The common electrode COM may be disposed on the light emitting layer EL of the first pattern BA_P of the undercut structure. The common electrode COM may be disposed on the pixel electrode PXL and the light emitting layer EL, to thereby form the light emitting element ED. The common electrode COM may be widely provided on the entire surface of the substrate SUB. The common electrode COM may be formed of a transparent conductive material such as Indium Tin Oxide ITO or Indium Zinc Oxide IZO, and may be formed of silver Ag, aluminum Al, magnesium Mg, calcium Ca, or an alloy thereof, which is thin enough to transmit light.

The common electrode COM may be in contact with the auxiliary power electrode 210 exposed by the contact portion CA and may be electrically connected to the auxiliary power electrode 210. The common electrode COM may be disposed to cover the bank layer BA and may be disposed on the auxiliary power electrode 210 in the undercut region UC of the undercut structure BA_P and PAS_P. For example, the common electrode COM may be formed of a material having excellent step coverage. The common electrode COM may have an excellent step coverage than the light emitting layer EL formed by the evaporation, whereby the light emitting layer EL may be disconnectedly provided in the undercut region UC of the undercut structure BA_P and PAS_P and may be formed on the auxiliary power electrode 210 exposed to the external. Accordingly, although the light emitting layer EL is not in contact with the auxiliary power electrode 210 in the undercut region UC of the undercut structure BA_P and PAS_P and the auxiliary power electrode 210 is formed to be exposed, the common electrode COM may be disposed on the upper surface of the auxiliary power electrode 210 exposed without being covered by the light emitting layer EL, and may be electrically connected to the auxiliary power electrode 210 in direct contact with the auxiliary power electrode 210.

Figure 4A:
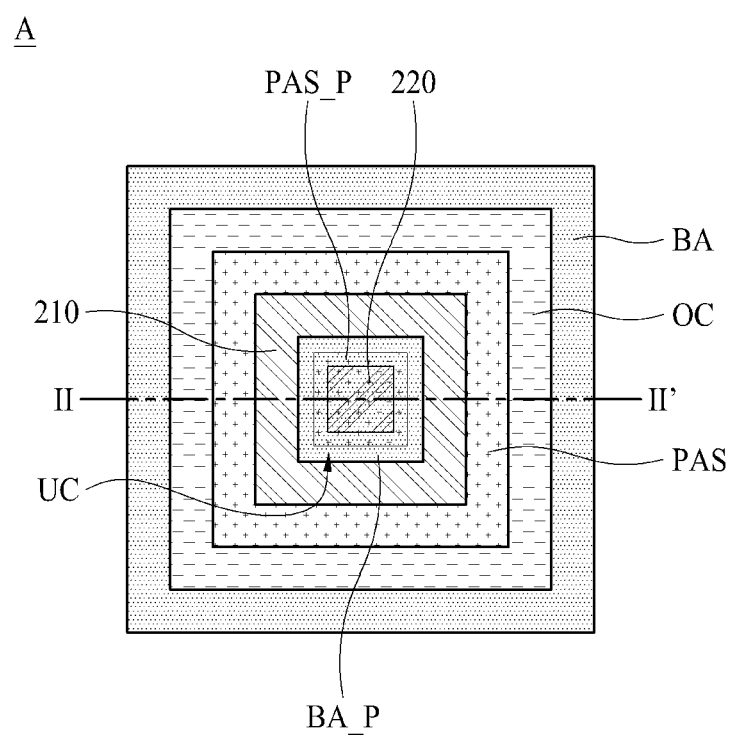
FIG. 4A is a plan view illustrating a contact area shown in 'A' of FIG. 3 according to one embodiment of the present disclosure.
Figure 4B:
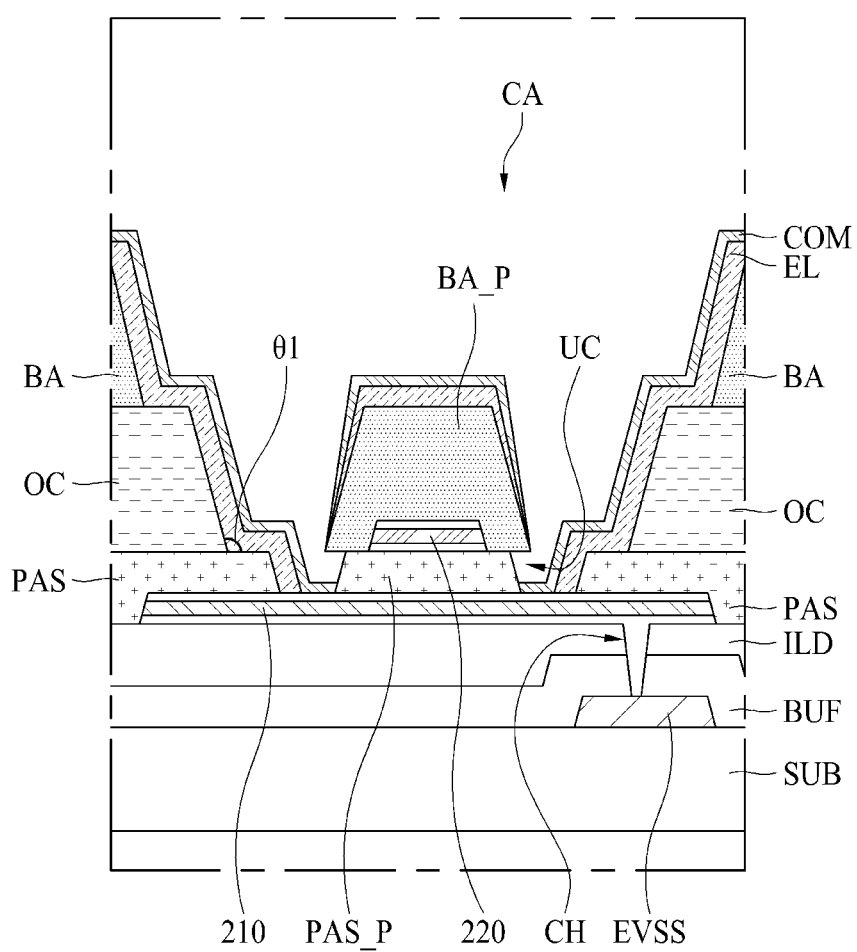
FIG. 4B is a cross sectional view along II-II' of FIG. 4A according to one embodiment of the present disclosure.

FIG. 4A is a plan view illustrating a contact area shown in 'A' of FIG. 3 according to one embodiment of the present disclosure. FIG. 4B is a cross sectional view along II' II' of FIG. 4A.

Referring to FIGS. 4A and 4B in connection with FIG. 3, the contact area of the light emitting display device 100 according to one embodiment of the present disclosure may include the contact portion CA which exposes a portion of the auxiliary power electrode 210. The contact portion CA penetrates through the passivation layer PAS (or second protective layer), the overcoat layer OC (or first protective layer), and the bank layer BA to expose a portion of the auxiliary power electrode 210. The undercut structure BA_P and PAS_P including the first pattern BA_P (or eaves structure) and the second pattern PAS_P (or pillar structure) may be disposed on the auxiliary power electrode 210 exposed by the contact portion CA.

The undercut structure BA_P and PAS_P may be disposed on a portion of the auxiliary power electrode 210 and may include the undercut region UC. The undercut structure BA_P and PAS_P may be formed in an island pattern on a portion of the auxiliary power electrode 210, and the exposed portion of the auxiliary power electrode 210 may be formed along the periphery of the undercut structure BA_P and PAS_P. The auxiliary power electrode 210, which is exposed along the periphery of the undercut structure BA_P and PAS_P in the contact portion CA, may be in contact with the common electrode COM (cathode electrode or second electrode) and may be electrically connected thereto. The undercut structure BA_P and PAS_P may include the first pattern BA_P (or eaves structure) formed of the same material as the bank layer BA and the second pattern PAS_P (or pillar structure) formed of the same material as the passivation layer PAS. In one embodiment, one or more side surfaces of the first pattern BA_P protrudes further than one or more side surfaces of the second pattern PAS_P to form the undercut structure. Differently, the undercut structure may have a first portion with a first width at a first distance from the auxiliary power electrode 210, and a second portion with a second width at a second distance from the auxiliary power electrode 210 smaller than the first distance, where the second width is smaller than the first width. The dummy electrode pattern 220 may be disposed between the first pattern BA_P and the second pattern PAS_P. The dummy electrode pattern 220 may be disposed between the first pattern BA_P and the second pattern PAS_P, to thereby enhance adhesion between the first pattern BA_P formed of the same material as the bank layer BA and the second pattern PAS_P formed of the same material as the passivation layer PAS. Thus, it is possible to prevent the first pattern BA_P from being lifted and separated from the second pattern PAS_P. The dummy electrode pattern 220 may be formed of the same material as the pixel electrode PXL.

The first pattern BA_P of the undercut structure BA_P and PAS_P may be formed of an organic insulating material, and the second pattern PAS_P may be formed of an inorganic insulating material. Also, the dummy electrode pattern 220 may be formed of a metal electrode material. The first pattern BA_P may be formed of the same material as the bank layer BA. The first pattern BA_P and the bank layer BA may be simultaneously formed through the same process. The second pattern PAS_P may be provided in the same layer as the passivation layer PAS and may be formed of the same material as the passivation layer PAS. The second pattern PAS_P and the passivation layer PAS may be simultaneously formed through the same process. The dummy electrode pattern 220 may be formed of the same material as the pixel electrode PXL. The dummy electrode pattern 220 and the pixel electrode PXL may be simultaneously formed through the same process. However, the present disclosure is not limited thereto.

The first pattern BA_P may be disposed on a portion of the auxiliary power electrode 210. The first pattern BA_P may be formed of an island pattern on the auxiliary power electrode 210, and the undercut region UC may be formed under the edge of the first pattern BA_P. The first pattern BA_P may be disposed on the second pattern PAS_P and may be overlapped with a portion of the exposed auxiliary power electrode 210.

The second pattern PAS_P may be overlapped with the first pattern BA_P on the top surface of the auxiliary power electrode 210 and may be configured to support the first pattern BA_P. The second pattern PAS_P may be formed in an island pattern on the auxiliary power electrode 210 and may include an upper surface which has a first width and is in contact with the first pattern BA_P, a lower surface which has a second width wider than the first width and is in contact with the auxiliary power electrode 210, and an inclined surface between the upper surface and the lower surface. In this case, the width of the lower surface of the first pattern BA_P may be greater than the first width of the upper surface of the second pattern PAS_P. Also, the width of the first pattern BA_P may be equal to or greater than the second width of the lower surface of the second pattern PAS_P. Since the lower surface of the first pattern BA_P has a greater width than the upper surface of the second pattern PAS_P, the undercut region UC may be formed below the edge of the first pattern BA_P. The undercut region UC may include a lower surface of the first pattern BA_P and a side surface of the second pattern PAS_P.

The dummy electrode pattern 220 may be disposed between the first pattern BA_P and the second pattern PAS_P. The dummy electrode pattern 220 may improve the adhesion between the first pattern BA_P formed of the bank layer BA and the second pattern PAS_P formed of the passivation layer PAS. The dummy electrode pattern 220 may be disposed on the upper surface of the second pattern PAS_P and may be covered by the first pattern BA_P. For example, the dummy electrode pattern 220 may be completely covered by the first pattern BA_P and the second pattern PAS_P and may not be exposed in the undercut region UC, but not limited thereto. For example, a portion of the dummy electrode pattern 220 may be partially exposed in the undercut region UC.

The second pattern PAS_P may be formed by etching a portion of the passivation layer PAS and exposing a portion of the auxiliary power electrode 210 to the periphery of the first pattern BA_P. The second pattern PAS_P may be over-etched in the area overlapped with the edge of the first pattern BA_P so that the second pattern PAS_P may be inwardly provided in comparison to the edge of the first pattern BA_P, to thereby form the undercut region UC.

As illustrated in FIGS. 4A and 4B, the undercut structure BA_P and PAS_P according to one embodiment of the present disclosure may have the undercut region UC formed under the edge of the first pattern BA_P. The undercut region UC may be formed by patterning the second pattern PAS_P corresponding to the edge of the first pattern BA_P to be inwardly provided in comparison to the edge of the first pattern BA_P. The undercut region UC may include a portion under the edge of the first pattern BA_P and a side surface of the second pattern PAS_P.

The light emitting layer EL may be formed on the undercut structure BA_P and PAS_P. The light emitting layer EL may be formed on a portion of the exposed region of the auxiliary power electrode along the step coverage of the passivation layer PAS, the overcoat layer OC and the bank layer BA in the periphery of the undercut structure BA_P and PAS_P. The light emitting layer EL may not be disposed on the auxiliary power electrode 210 corresponding to the undercut region UC in the exposed region of the auxiliary power electrode 210. Since the light emitting layer EL is formed of a material having inferior step coverage, the light emitting layer is not formed in the auxiliary power electrode 210 of the undercut region UC and is disconnectedly provided therein, whereby the light emitting layer EL may have the minimized area disposed on the exposed region of the auxiliary power electrode 210.

The common electrode COM may be formed on the light emitting layer EL. The common electrode COM may be formed on the light emitting layer EL of the undercut structure BA_P and PAS_P and the common electrode may be formed on the emission layer EL along the step coverage among the passivation layer PAS, the overcoat layer OC, and the bank layer BA in the periphery of the undercut structure BA_P and PAS_P. Also, the common electrode COM may be disposed on the upper surface of the auxiliary power electrode 210 exposed without being covered by the light emitting layer EL and may be electrically connected to the auxiliary power electrode 210 in direct contact with the auxiliary power electrode 210. Since the common electrode COM is formed of a material having step coverage higher than that of the light emitting layer EL, the common electrode COM may be formed onto the auxiliary power electrode 210 of the undercut region UC in which the light emitting layer EL is not formed, whereby the common electrode COM may be in direct contact with the auxiliary power electrode 210 and may be electrically connected to the auxiliary power electrode 210. For example, the common electrode COM may contact the auxiliary power electrode 210 at a region under the wider first portion of the undercut structure. Accordingly, in case of the light emitting display device 100 according to one embodiment of the present disclosure, even though the auxiliary power electrode 210 overlapped with the undercut region UC is not covered by the light emitting layer EL, the common electrode COM is in direct contact with the auxiliary power electrode 210 exposed without being covered by the light emitting layer EL and is electrically connected to the auxiliary power electrode 210, thereby reducing non-uniformity of the voltage drop due to the resistance variation of the common electrode (COM) in the entire display panel.

Meanwhile, in the light emitting display device 100 according to one embodiment of the present disclosure, the overcoat layer OC may be patterned to expose a portion of the passivation layer PAS in the periphery of the contact portion CA. In this case, the step coverage may be formed between the overcoat layer OC and the passivation layer PAS. In the step coverage region between the overcoat layer OC and the passivation layer PAS, an angle θ1 between the upper surface of the passivation layer PAS and the side surface of the overcoat layer OC may be close to a right angle so that the inclined surface may be steep, which may act as a factor which reduces the coverage characteristic of the material to be deposited in the subsequent process. In one embodiment, the step coverage region may also refer to a location where an upper surface of one layer and a side surface of another layer intersect. For example, the step coverage region may also refer to a location where an upper surface of the passivation layer PAS intersects with a side surface of the overcoat layer OC, but examples are not limited hereto.

Also, in the light emitting display device 100 according to one embodiment of the present disclosure, the dummy electrode pattern 220 may be formed on the passivation layer PAS. The dummy electrode pattern 220 may be disposed on the passivation layer PAS corresponding to a position where the second pattern PAS_P of the undercut structure BA_P and PAS_P is to be formed. The dummy electrode pattern 220 may be formed of the same material as the pixel electrode PXL formed on the overcoat layer OC through the same process. The dummy electrode pattern 220 may be patterned for the process in which the pixel electrode PXL is patterned to correspond to each of the subpixels SP1, SP2, SP3, and SP4. In this case, a metal foreign material generated from the dummy electrode pattern 220 may be stacked in the step coverage region between the passivation layer PAS and the overcoat layer OC. This may reduce the coverage characteristic of the material to be deposited in the subsequent process or may function as a factor to diffuse the defect.

Figure 5A:
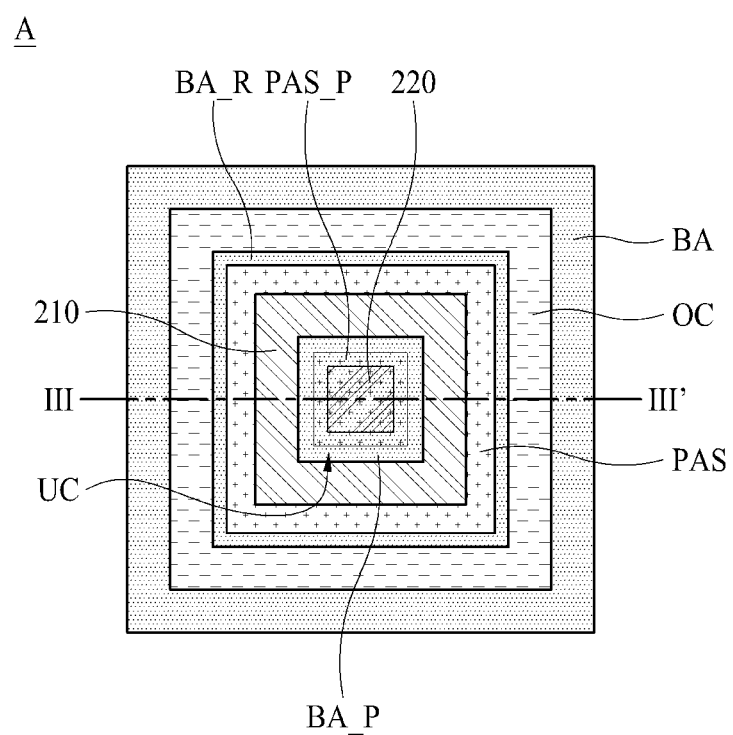
FIG. 5A is a plan view illustrating a contact area shown in 'A' of FIG. 3 according to another embodiment of the present disclosure.
Figure 5B:
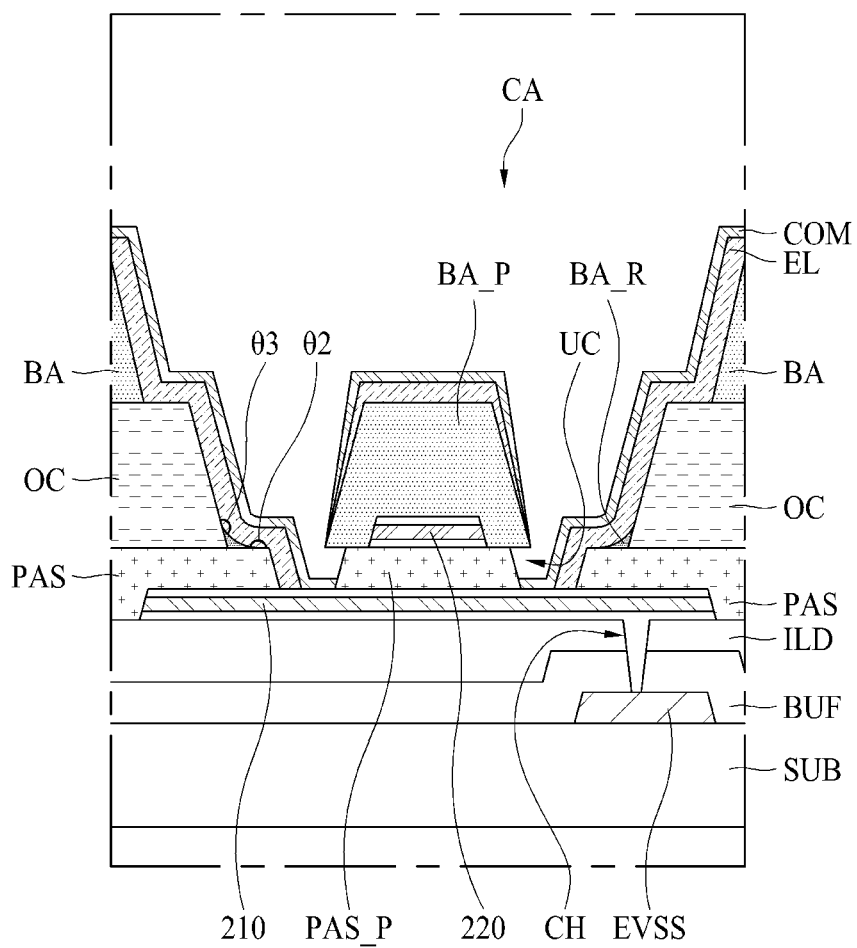
FIG. 5B is a cross sectional view along of FIG. 5A according to one embodiment of the present disclosure.

FIG. 5A is a plan view illustrating a contact area shown in 'A' of FIG. 3 according to another embodiment of the present disclosure. FIG. 5B is a cross sectional view along of FIG. 5A.

Referring to FIGS. 5A and 5B in connection with FIG. 3, a contact area of the light emitting display device 100 according to another embodiment of the present disclosure may include a contact portion CA which exposes a portion of an auxiliary power electrode 210. The contact portion CA may pass through a passivation layer PAS (or second protective layer), an overcoat layer OC (or first protective layer), and a bank layer BA to expose a portion of the auxiliary power electrode 210. An undercut structure BA_P and PAS_P including a first pattern BA_P (or eaves structure) and a second pattern PAS_P (or pillar structure) may be disposed on the auxiliary power electrode 210 exposed by the contact portion CA. In addition, a step cover pattern BA_R may be disposed in the step coverage region between the overcoat layer OC and the passivation layer PAS in the periphery of the contact portion CA. As described above, one or more side surfaces of the first pattern BA_P protrudes further than one or more side surfaces of the second pattern PAS_P to form the undercut structure. Differently, the undercut structure may have a first portion with a first width at a first distance from the auxiliary power electrode 210, and a second portion with a second width at a second distance from the auxiliary power electrode 210 smaller than the first distance, where the second width is smaller than the first width.

The light emitting display device 100 according to another embodiment of the present disclosure illustrated in FIGS. 5A and 5B is substantially the same as the light emitting display device 100 according to one embodiment of the present disclosure illustrated in FIGS. 4A and 4B except for a structure in which the step cover pattern BA_R is disposed in the step coverage region, whereby the same reference numerals will be used throughout the drawings to refer to the same components, and a redundant description thereof will be omitted or simplified.

As shown in FIGS. 5A and 5B, in the light emitting display device 100 according to another embodiment of the present disclosure, the step coverage region may be formed at each boundary of each layer in the form of step in which the passivation layer PAS, the overcoat layer OC, and the bank layer BA are disposed in the periphery of the auxiliary power electrode 210 exposed by the contact portion CA.

The step cover pattern BA_R may be disposed in the step coverage region between the passivation layer PAS and the overcoat layer OC. The step cover pattern BA_R may be formed of an organic insulating material. The step cover pattern BA_R may be formed of a material different from that of the passivation layer PAS and the overcoat layer OC. The step cover pattern BA_R may be formed of the same material as the bank layer BA disposed on the overcoat layer OC. The step cover pattern BA_R and the bank layer BA may be simultaneously formed through the same process.

The step cover pattern BA_R may be formed by depositing a bank material layer for the bank layer BA, and adjusting the time of a soft baking process in which heat treatment is performed on the deposited bank material layer, or the time of a development process of patterning the bank layer BA, so that a portion of the bank material layer may remain in the step coverage region between the passivation layer PAS and the overcoat layer OC. For example, the step cover pattern BA_R may be formed by relatively reducing the soft baking process time or developing process time in comparison to a case where the step cover pattern is not formed.

Also, the first pattern BA_P of the undercut structure BA_P and PAS_P may be formed of the same material as the step cover pattern BA_R. The step cover pattern BA_R, the first pattern BA_P, and the bank layer BA may be simultaneously formed through the same process. As illustrated in FIG. 5A, the step cover pattern BA_R may be formed in the form of a closed loop along the step coverage region between the passivation layer PAS and the overcoat layer OC.

The step cover pattern BA_R may be formed after patterning the dummy electrode pattern 220 on the passivation layer PAS. The step cover pattern BA_R may be formed from the dummy electrode pattern 220 during the patterning process of the dummy electrode pattern 220 and may be configured to cover the metal foreign material stacked in the step coverage region between the passivation layer PAS and the overcoat layer OC.

The step cover pattern BA_R may be formed between the upper surface of the passivation layer PAS and the side surface of the overcoat layer OC in the step coverage region between the passivation layer PAS and the overcoat layer OC. The step cover pattern BA_R may be formed to have an inclined surface between the upper surface of the passivation layer PAS and the side surface of the overcoat layer OC. The inclined surface of the step cover pattern BA_R may expand an angle θ2 with the upper surface of the passivation layer PAS and an angle θ3 with the side surface of the overcoat layer OC, thereby gently completing the step coverage region between the overcoat layer OC and the passivation layer PAS.

In the light emitting display device 100 according to another embodiment of the present disclosure, since the step cover pattern BA_R is formed in the form of a closed loop along the step coverage region between the passivation layer PAS and the overcoat layer OC, the step coverage region between the overcoat layer OC and the passivation layer PAS may be completed gently, whereby it is possible to improve the coverage characteristic of the material to be deposited in the subsequent process.

According to another embodiment of the present disclosure, the light emitting display device 100 may be formed to cover the metal foreign material that may be stacked in the step coverage region between the passivation layer PAS and the overcoat layer OC, thereby preventing the diffusion of defects caused by the metal foreign matter.

Figure 6:
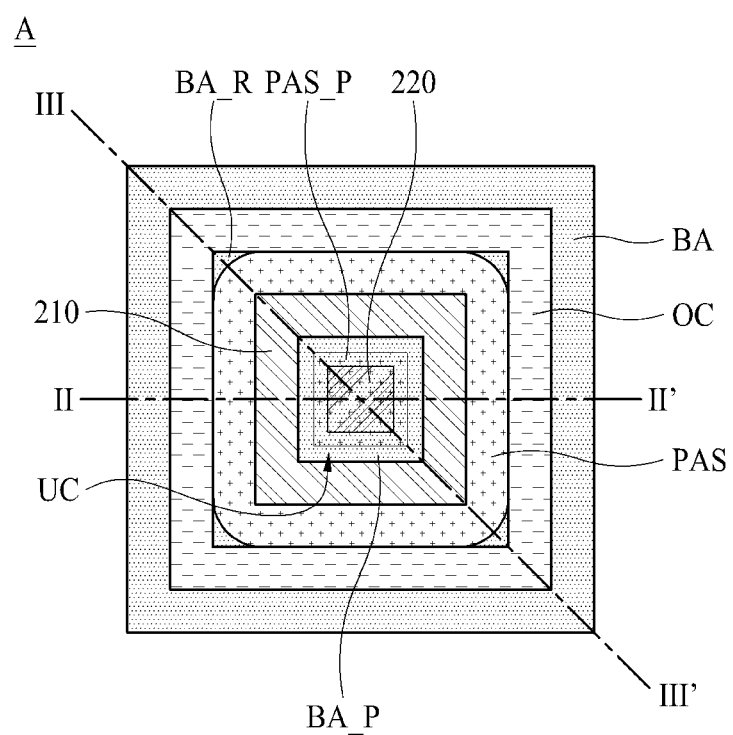
FIG. 6 is a plan view illustrating a contact area shown in 'A' of FIG. 3 according to another embodiment of the present disclosure.

FIG. 6 is a plan view illustrating a contact area shown in 'A' of FIG. 3 according to another embodiment of the present disclosure. In FIG. 6, a cross-sectional view along II-IP is substantially the same as that of FIG. 4B, and a cross-sectional view along is substantially the same as that of FIG. 5B.

Referring to FIG. 6 in connection with FIGS. 3, 4B and 5 B, a contact area of the light emitting display device 100 according to another embodiment of the present disclosure may include a contact portion CA which exposes a portion of an auxiliary power electrode 210. The contact portion CA may pass through a passivation layer PAS (or second protective layer), an overcoat layer OC (or first protective layer), and a bank layer BA to expose a portion of the auxiliary power electrode 210. An undercut structure BA_P and PAS_P including a first pattern BA_P (or eaves structure) and a second pattern PAS_P (or pillar structure) may be disposed on the auxiliary power electrode 210 exposed by the contact portion CA. In addition, a step cover pattern BA_R may be disposed at each inner edge in a step coverage region between the overcoat layer OC and the passivation layer PAS in the periphery of the contact portion CA. As described above, one or more side surfaces of the first pattern BA_P protrudes further than one or more side surfaces of the second pattern PAS_P to form the undercut structure. Differently, the undercut structure may have a first portion with a first width at a first distance from the auxiliary power electrode 210, and a second portion with a second width at a second distance from the auxiliary power electrode 210 smaller than the first distance, where the second width is smaller than the first width.

The light emitting display device 100 according to another embodiment of the present disclosure shown in FIG. 6 is substantially the same as the configuration of the light emitting display device 100 according to one embodiment of the present specification shown in FIGS. 4A and 4B, or the configuration of the light emitting display device 100 according to another embodiment of the present disclosure shown in FIGS. 5A and 5B except for the arrangement structure of the step cover pattern BA_R in the corner of the step coverage region, whereby the same reference numerals will be used throughout the drawings to refer to the same components, and a redundant description thereof will be omitted or simplified.

As shown in FIG. 6, in the light emitting display device 100 according to another embodiment of the present disclosure, the step coverage region may be formed at each boundary of each layer in the form of step in which the passivation layer PAS, the overcoat layer OC, and the bank layer BA are disposed in the periphery of the auxiliary power electrode 210 exposed by the contact portion CA.

A step cover pattern BA_R may be disposed at each inner edge in the step coverage region between the passivation layer PAS and the overcoat layer OC. The step cover pattern BA_R may be formed of an organic insulating material. The step cover pattern BA_R may be formed of a material different from that of the passivation layer PAS and the overcoat layer OC. The step cover pattern BA_R may be formed of the same material as the bank layer BA disposed on the overcoat layer OC. The step cover pattern BA_R and the bank layer BA may be simultaneously formed through the same process.

The step cover pattern BA_R may be formed by depositing a bank material layer for the bank layer BA, and adjusting the time of a soft baking process in which heat treatment is performed on the deposited bank material layer, or the time of a development process of patterning the bank layer BA, so that a portion of the bank material layer may remain in each inner edge of the step coverage region between the passivation layer PAS and the overcoat layer OC.

Also, the first pattern BA_P of the undercut structure BA_P and PAS_P may be formed of the same material as the step cover pattern BA_R. The step cover pattern BA_R, the first pattern BA_P, and the bank layer BA may be simultaneously formed through the same process. As illustrated in FIG. 6, the step cover pattern BA_R may be formed partially in each inner edge of the step coverage region between the passivation layer PAS and the overcoat layer OC.

The step cover pattern BA_R may be formed at each inner corner portion in the step coverage region between the passivation layer PAS and the overcoat layer OC. The step cover pattern BA_R may be formed at an inner corner portion where adjacent inner surfaces of the overcoat layer OC meet. The inner corner at which the adjacent inner surfaces of the overcoat layer OC meet may act as a factor that further degrades the coverage characteristics of the material to be deposited in the subsequent process. For example, the inner corner portion may refer to a region where an upper surface of a second layer intersects with a side surface of a first layer and another side surface of the first layer. For example, the inner corner portion may be a region where an upper surface of the passivation layer PAS intersects with a side surface of the overcoat layer OC and another side surface of the overcoat layer OC.

In the light emitting display device 100 according to another embodiment of the present disclosure, the step cover pattern BA_R is partially formed in each inner corner portion of the step coverage region between the passivation layer PAS and the overcoat layer OC, thereby improving the coverage characteristic of the material to be deposited in the subsequent process.

Figure 7:
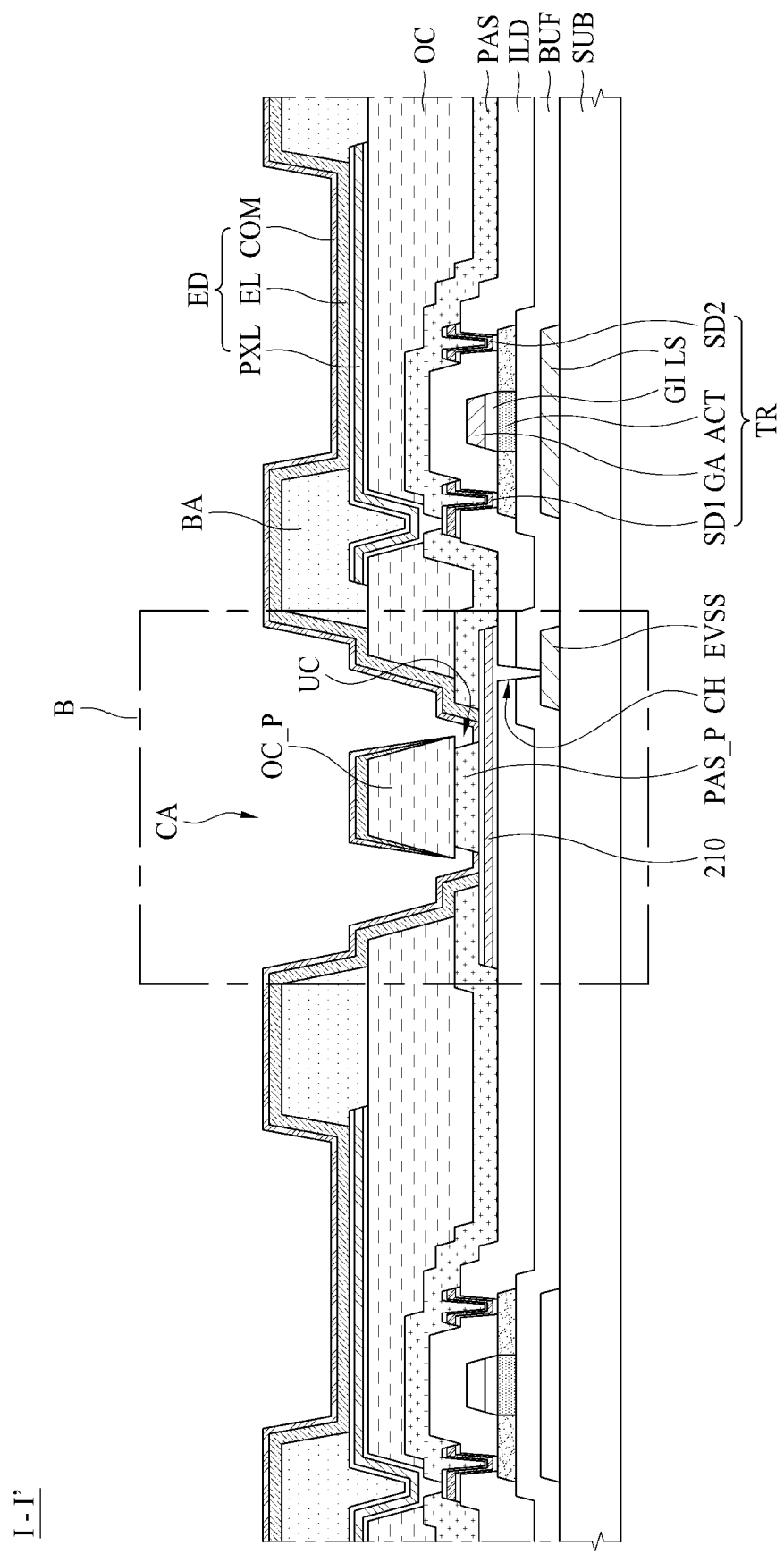
FIG. 7 is a cross sectional view illustrating a light emitting display device according to another embodiment of the present disclosure along I-I' of FIG. 2.

FIG. 7 is a cross-sectional view illustrating a light emitting display device according to another embodiment of the present disclosure along I-I' of FIG. 2.

Referring to FIG. 7, the light emitting display device 100 according to another embodiment of the present disclosure may include a substrate SUB, a light shielding layer LS, an auxiliary power line EVSS (second power line or common power line), a buffer layer BUF, a thin film transistor TR, a storage capacitor, a gate insulating film GI, an interlayer insulating film ILD, an auxiliary power electrode 210, a passivation layer PAS (or second protective layer), an overcoat layer OC (first protective layer or planarization layer), a light emitting element ED, a bank layer BA, a contact portion CA, and an undercut structure OC_P and PAS_P including a first pattern OC_P and a second pattern PAS_P.

The light emitting display device 100 according to another embodiment of the present disclosure illustrated in FIG. 7 is substantially the same as the light emitting display device 100 according to the embodiment of the present disclosure shown in FIG. 3 except for the structure in which the first pattern OC_P (or eaves structure) of the undercut structure OC_P and PAS_P is provided in the same layer as the overcoat layer OC and formed of the same material as the overcoat layer OC and a dummy electrode pattern 220 is excluded, whereby the same reference numerals will be used throughout the drawings to refer to the same components, and a redundant description thereof will be omitted or simplified.

As shown in FIG. 7, the contact portion CA according to another embodiment of the present disclosure may pass through the passivation layer PAS, the overcoat layer OC, and the bank layer CA to expose a portion of the auxiliary power electrode 210. The undercut structure OC_P having an undercut region UC may be disposed on the auxiliary power electrode 210 exposed by the contact portion CA.

The undercut structure OC_P may be disposed on a portion of the auxiliary power electrode 210 and may include the undercut region UC. The undercut structure OC_P and PAS_P may be formed in an island pattern on a portion of the auxiliary power electrode 210, and the auxiliary power electrode 210 may be exposed in the periphery of the undercut structure OC_P and PAS_P. The auxiliary power electrode 210, which is exposed in the periphery of the undercut structure OC_P and PAS_P in the contact portion CA, may be in contact with a common electrode COM (cathode electrode or second electrode) to be electrically connected thereto. The undercut structure OC_P and PAS_P may be formed of the same material as the passivation layer PAS and the overcoat layer OC. The undercut structure OC_P and PAS_P may include a first pattern OC_P (or eaves structure) made of the same material as the overcoat layer OC and a second pattern PAS_P (or pillar structure) made of the same material as the passivation layer PAS. As described above, one or more side surfaces of the first pattern OC_P protrudes further than one or more side surfaces of the second pattern PAS_P to form the undercut structure. Differently, the undercut structure may have a first portion with a first width at a first distance from the auxiliary power electrode 210, and a second portion with a second width at a second distance from the auxiliary power electrode 210 smaller than the first distance, where the second width is smaller than the first width.

The light emitting layer EL may be disposed on the pixel electrode PXL and the bank layer BA. The light emitting layer EL may be disposed on the overcoat layer OC. Also, the light emitting layer EL may be disposed on the first pattern OC_P of the undercut structure OC_P and PAS_P. The light emitting layer EL may be disposed on the auxiliary power electrode 210 exposed through the contact portion CA. The light emitting layer EL may be disconnectedly provided in the undercut region UC by the undercut structure OC_P and PAS_P positioned in the contact portion CA. For example, the light emitting layer EL may be formed of a material having inferior step coverage. Accordingly, the light emitting layer EL may have the minimized area disposed on the auxiliary power electrode 210 owing to the undercut structure OC_P and PAS_P, and the light emitting layer EL is disconnectedly provided in the undercut region UC of the undercut structure OC_P and PAS_P, whereby the auxiliary power electrode 210 disposed thereunder is exposed.

The common electrode COM (cathode electrode or second electrode) may be disposed on the light emitting layer EL. The common electrode COM may be disposed on the light emitting layer EL of the first pattern OC_P of the undercut structure OC_P and PAS_P. The common electrode COM may be disposed on the pixel electrode PXL and the light emitting layer EL, to thereby form the light emitting element ED. The common electrode COM may be widely provided on the entire surface of the substrate SUB. The common electrode COM may be formed of a transparent conductive material such as Indium Tin Oxide ITO or Indium Zinc Oxide IZO, and may be formed of silver Ag, aluminum Al, magnesium Mg, calcium Ca, or an alloy thereof, which is thin enough to transmit light.

The common electrode COM may be in contact with the auxiliary power electrode 210 exposed by the contact portion CA and may be electrically connected to the auxiliary power electrode 210. The common electrode COM may be disposed to cover the bank layer BA and may be disposed on the auxiliary power electrode 210 in the undercut region UC of the undercut structure OC_P and PAS_P. For example, the common electrode COM may be formed of a material having excellent step coverage. The common electrode COM may have an excellent step coverage than the light emitting layer EL formed by the evaporation, whereby the light emitting layer EL may be disconnectedly provided in the undercut region UC of the undercut structure OC_P and PAS_P and may be formed on the auxiliary power electrode 210 exposed to the external. Accordingly, although the light emitting layer EL is not in contact with the auxiliary power electrode 210 in the undercut region UC of the undercut structure OC_P and PAS_P and the auxiliary power electrode 210 is formed to be exposed, the common electrode COM may be disposed on the upper surface of the auxiliary power electrode 210 exposed without being covered by the light emitting layer EL, and may be electrically connected to the auxiliary power electrode 210 in direct contact with the auxiliary power electrode 210.

Figure 8A:
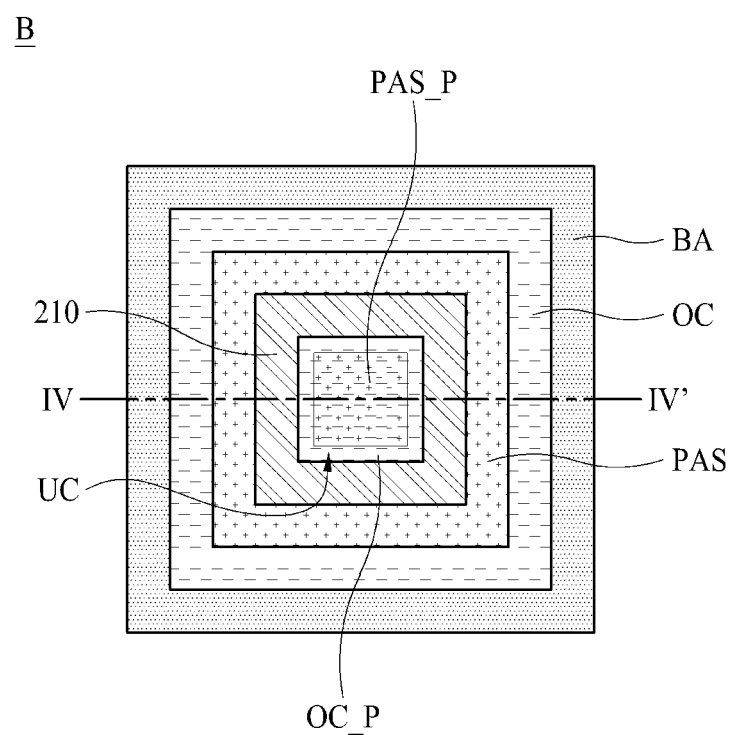
FIG. 8A is a plan view illustrating a contact area shown in 'B' of FIG. 7 according to another embodiment of the present disclosure.
Figure 8B:
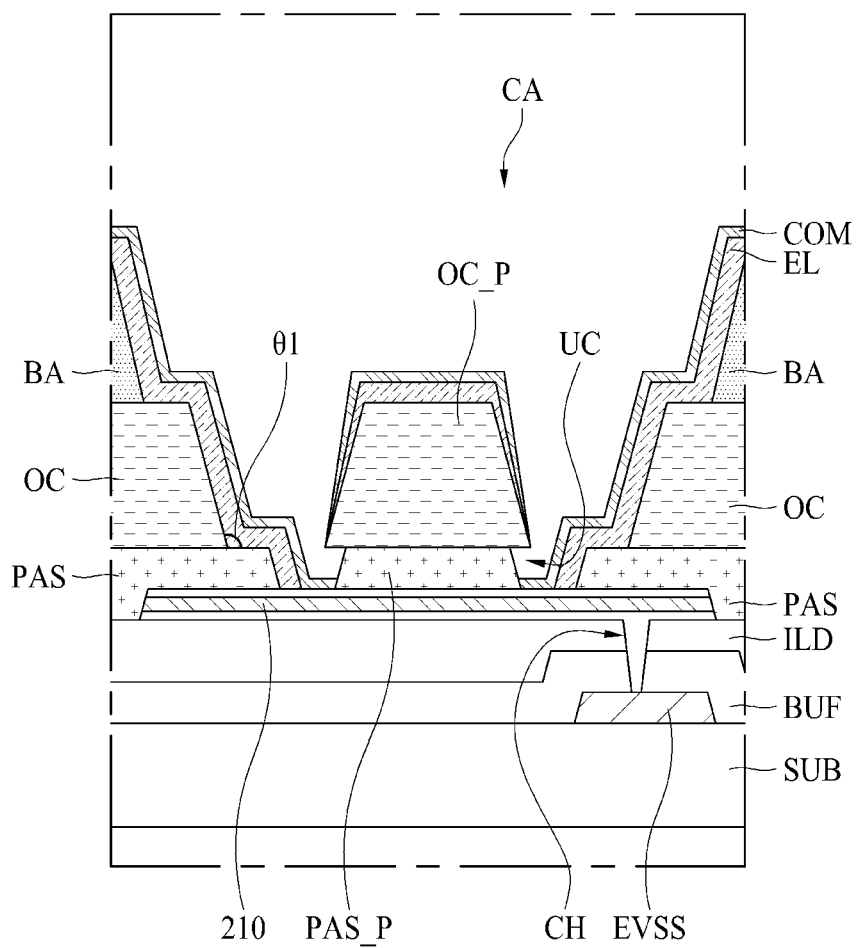
FIG. 8B is a cross sectional view along IV-IV' of FIG. 8A according to an embodiment of the present disclosure.

FIG. 8A is a plan view illustrating a contact area shown in 'B' of FIG. 7 according to another embodiment of the present disclosure. FIG. 8B is a cross sectional view along IV-IV' of FIG. 8A according to one embodiment of the present disclosure.

Referring to FIGS. 8A and 8B in connection with FIG. 7, the contact area of the light emitting display device 100 according to another embodiment of the present disclosure may include a contact portion CA which exposes a portion of an auxiliary power electrode 210. The contact portion CA may pass through a passivation layer PAS (or second protective layer), an overcoat layer OC (or first protective layer), and a bank layer BA to expose a portion of the auxiliary power electrode 210. An undercut structure OC_P including a first pattern OC_P (or eaves structure) and a second pattern PAS_P (or pillar structure) may be disposed on the auxiliary power electrode 210 exposed by the contact portion CA.

The undercut structure OC_P may be disposed on a portion of the auxiliary power electrode 210 and may include an undercut region UC. The undercut structure OC_P and PAS_P may be formed in an island pattern on a portion of the auxiliary power electrode 210, and an exposed portion of the auxiliary power electrode 210 may be formed in the periphery of the undercut structure OC_P and PAS_P. The auxiliary power electrode 210, which is exposed in the periphery of the undercut structure OC_P and PAS_P in the contact portion CA, may be in contact with a common electrode COM (cathode electrode or second electrode) to be electrically connected thereto. The undercut structure OC_P and PAS_P may be formed of the same material as the passivation layer PAS and the overcoat layer OC. The undercut structure OC_P and PAS_P may include a first pattern OC_P (or eaves structure) formed of the same material as the overcoat layer OC and a second pattern PAS_P (or pillar structure) formed of the same material as the passivation layer PAS. As described above, one or more side surfaces of the first pattern OC_P protrudes further than one or more side surfaces of the second pattern PAS_P to form the undercut structure. Differently, the undercut structure may have a first portion with a first width at a first distance from the auxiliary power electrode 210, and a second portion with a second width at a second distance from the auxiliary power electrode 210 smaller than the first distance, where the second width is smaller than the first width.

The first pattern OC_P of the undercut structure OC_P and PAS_P may be formed of an organic insulating material, and the second pattern PAS_P may be formed of an inorganic insulating material. The first pattern OC_P may be formed of the same material on the same layer as the overcoat layer OC. The first pattern OC_P and the overcoat layer OC may be simultaneously formed through the same process. The second pattern PAS_P may be provided in the same layer as the passivation layer PAS and formed of the same material as the passivation layer PAS. The second pattern PAS_P and the passivation layer PAS may be simultaneously formed through the same process. However, the present disclosure is not limited thereto.

The first pattern OC_P may be disposed on a portion of the auxiliary power electrode 210. The first pattern OC_P may be formed of an island pattern on the auxiliary power electrode 210, and the undercut region UC may be formed under the edge of the first pattern OC_P. The first pattern OC_P may be disposed on the second pattern PAS_P and may be overlapped with a portion of the exposed auxiliary power electrode 210.

The second pattern PAS_P may be overlapped with the first pattern OC_P on the top surface of the auxiliary power electrode 210 and may be configured to support the first pattern OC_P. The second pattern PAS_P may be formed in an island pattern on the auxiliary power electrode 210 and may include an upper surface which has a first width and is in contact with the first pattern OC_P, a lower surface which has a second width wider than the first width and is in contact with the auxiliary power electrode 210, and an inclined surface between the upper surface and the lower surface. In this case, the width of the lower surface of the first pattern OC_P may be greater than the first width of the upper surface of the second pattern PAS_P. Also, the width of the first pattern OC_P may be equal to or greater than the second width of the lower surface of the second pattern PAS_P. Since the lower surface of the first pattern OC_P has a greater width than the upper surface of the second pattern PAS_P, the undercut region UC may be formed below the edge of the first pattern OC_P. The undercut region UC may include a side surface of the first pattern OC_P and a side surface of the second pattern PAS_P.

The second pattern PAS_P may be formed by etching the passivation layer PAS overlapped with the first pattern OC_P so as to expose a portion of the auxiliary power electrode 210 in the periphery of the first pattern OC_P. The second pattern PAS_P may be over-etched in the area overlapped with the edge of the first pattern OC_P so that the second pattern PAS_P may be inwardly provided in comparison to the edge of the first pattern OC_P, to thereby form the undercut region UC.

As illustrated in FIGS. 8A and 8B, the undercut structure OC_P and PAS_P according to another embodiment of the present disclosure may have the undercut region UC formed under the edge of the first pattern OC_P. The undercut region UC may be formed by patterning the second pattern PAS_P corresponding to the edge of the first pattern OC_P to be more inwardly positioned than the edge of the first pattern OC_P. The undercut region UC may include a portion under the edge of the first pattern OC_P and a side surface of the second pattern PAS_P.

The light emitting layer EL may be formed on the undercut structure OC_P and PAS_P. The light emitting layer EL may be formed on a portion of the exposed region of the auxiliary power electrode along the step coverage of the passivation layer PAS, the overcoat layer OC and the bank layer BA in the periphery of the undercut structure OC_P and PAS_P. The light emitting layer EL may not be disposed on the auxiliary power electrode 210 corresponding to the undercut region UC in the exposed region of the auxiliary power electrode 210. Since the light emitting layer EL is formed of a material having inferior step coverage, the light emitting layer is not formed in the auxiliary power electrode 210 of the undercut region UC and is disconnectedly provided therein, whereby the light emitting layer EL may have the minimized area disposed on the exposed region of the auxiliary power electrode 210.

The common electrode COM may be formed on the light emitting layer EL. The common electrode COM may be formed on the light emitting layer EL of the undercut structure OC_P and PAS_P and the common electrode may be formed on the emission layer EL along the step coverage among the passivation layer PAS, the overcoat layer OC, and the bank layer BA in the periphery of the undercut structure OC_P and PAS_P. Also, the common electrode COM may be disposed on the upper surface of the auxiliary power electrode 210 exposed without being covered by the light emitting layer EL and may be electrically connected to the auxiliary power electrode 210 in direct contact with the auxiliary power electrode 210. Since the common electrode COM is formed of a material having step coverage higher than that of the light emitting layer EL, the common electrode COM may be formed onto the auxiliary power electrode 210 of the undercut region UC in which the light emitting layer EL is not formed, whereby the common electrode COM may be in direct contact with the auxiliary power electrode 210 and may be electrically connected to the auxiliary power electrode 210. Accordingly, in case of the light emitting display device 100 according to one embodiment of the present disclosure, even though the auxiliary power electrode 210 overlapped with the undercut region UC is not covered by the light emitting layer EL, the common electrode COM is in direct contact with the auxiliary power electrode 210 exposed without being covered by the light emitting layer EL and is electrically connected to the auxiliary power electrode 210, thereby reducing non-uniformity of the voltage drop due to the resistance variation of the common electrode (COM) in the entire display panel.

In the light emitting display device 100 according to another embodiment of the present disclosure, the undercut structure OC_P and PAS_P is formed on the auxiliary power electrode 210 exposed by the contact portion CA, wherein the undercut structure OC_P and PAS_P uses the overcoat layer OC and the passivation layer PAS having excellent adhesion characteristics in comparison to the bank layer BA and the passivation layer PAS, so that it is possible to form the undercut shape having high separation resistance by improving structural stability of the undercut structure OC_P and PAS_P without a metal pattern for improvement of the adhesion in the undercut structure, and to prevent the diffusion of defects caused by the metal foreign matter. Meanwhile, in the light emitting display device 100 according to another embodiment of the present disclosure, the overcoat layer OC may be patterned to expose a portion of the passivation layer PAS in the periphery of the contact portion CA. In this case, the step coverage may be formed between the overcoat layer OC and the passivation layer PAS. In the step coverage region between the overcoat layer OC and the passivation layer PAS, an angle θ1 between the upper surface of the passivation layer PAS and the side surface of the overcoat layer OC may be close to a right angle so that the inclined surface may be steep to be close to a right angle, which may act as a factor which reduces the coverage characteristic of the material to be deposited in the subsequent process.

Figure 9A:
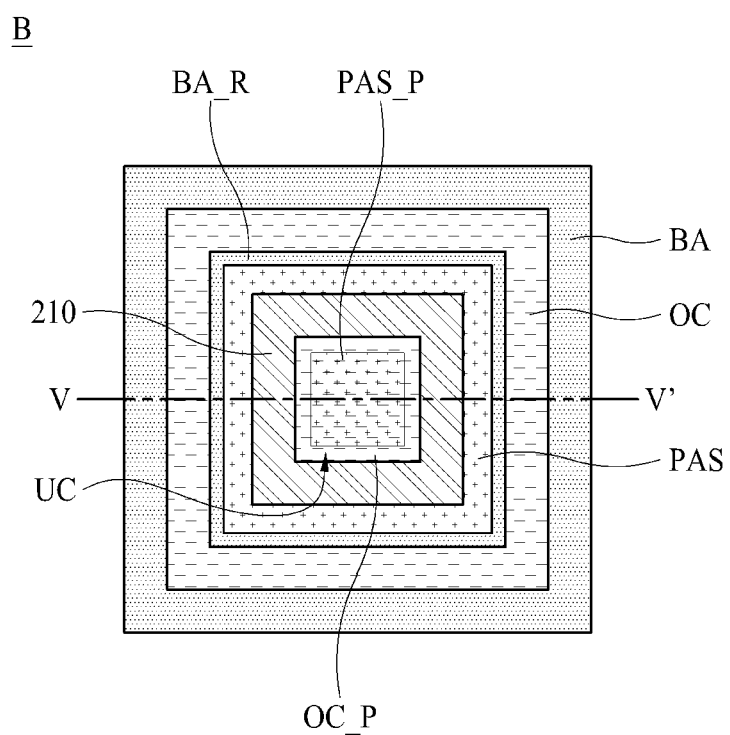
FIG. 9A is a plan view illustrating a contact area shown in 'B' of FIG. 7 according to another embodiment of the present disclosure.
Figure 9B:
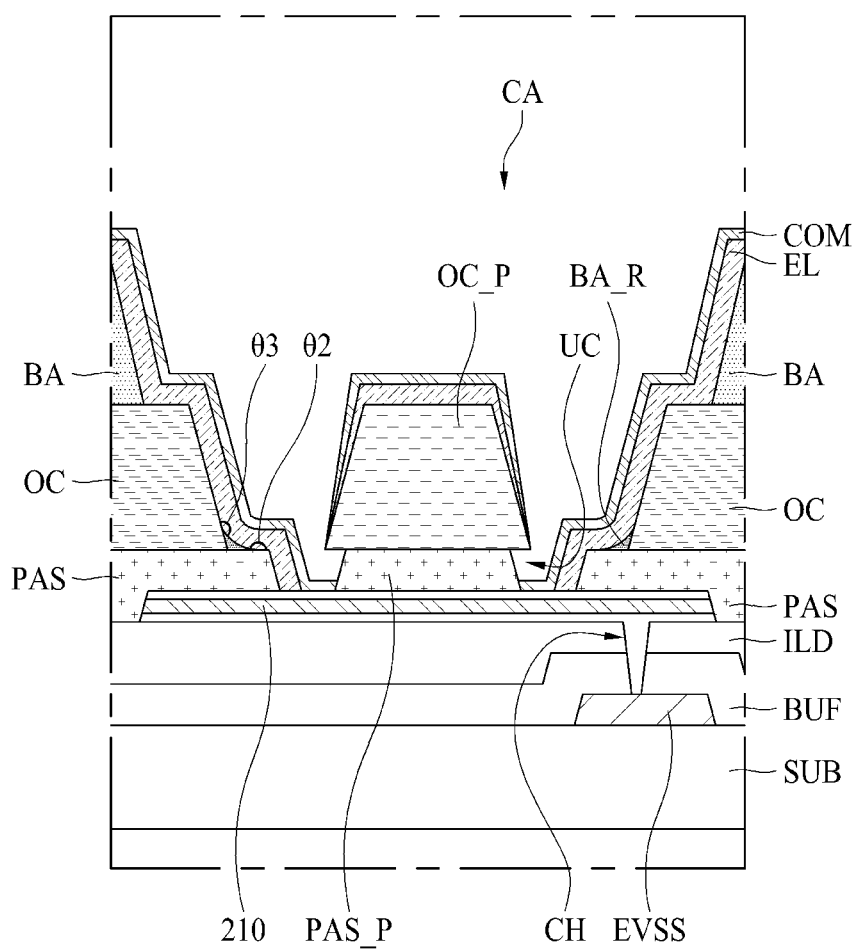
FIG. 9B is a cross sectional view along V-V' of FIG. 9A according to one embodiment of the present disclosure.

FIG. 9A is a plan view illustrating a contact area shown in 'B' of FIG. 7 according to another embodiment of the present disclosure. FIG. 9B is a cross sectional view along V-V' of FIG. 9A according to an embodiment of the present disclosure.

Referring to FIGS. 9A and 9B in connection with FIG. 7, a contact area of the light emitting display device 100 according to another embodiment of the present disclosure may include a contact portion CA which exposes a portion of an auxiliary power electrode 210. The contact portion CA may pass through a passivation layer PAS (or second protective layer), an overcoat layer OC (or first protective layer), and a bank layer BA to expose a portion of the auxiliary power electrode 210. An undercut structure OC_P and PAS_P including a first pattern OC_P (or eaves structure) and a second pattern PAS_P (or pillar structure) may be disposed on the auxiliary power electrode 210 exposed by the contact portion CA. In addition, a step cover pattern BA_R may be disposed in a step coverage region between the overcoat layer OC and the passivation layer PAS in the periphery of the contact portion CA.

The light emitting display device 100 according to another embodiment of the present disclosure shown in FIGS. 9A and 9B is substantially the same as the configuration of the light emitting display device 100 according to one embodiment of the present specification shown in FIGS. 8A and 8B except for the arrangement structure of the step cover pattern BA_R in the step coverage region, whereby the same reference numerals will be used throughout the drawings to refer to the same components, and a redundant description thereof will be omitted or simplified.

As shown in FIGS. 9A and 9B, in the light emitting display device 100 according to another embodiment of the present disclosure, the step coverage region may be formed at each boundary of each layer in the form of step in which the passivation layer PAS, the overcoat layer OC, and the bank layer BA are disposed in the periphery of the auxiliary power electrode 210 exposed by the contact portion CA.

The step cover pattern BA_R may be disposed in the step coverage region between the passivation layer PAS and the overcoat layer OC. The step cover pattern BA_R may be formed of an organic insulating material. The step cover pattern BA_R may be formed of a material different from that of the passivation layer PAS and the overcoat layer OC. The step cover pattern BA_R may be formed of the same material as the bank layer BA disposed on the overcoat layer OC. The step cover pattern BA_R and the bank layer BA may be simultaneously formed through the same process.

The step cover pattern BA_R may be formed by depositing a bank material layer for the bank layer BA, and adjusting the time of a soft baking process in which heat treatment is performed on the deposited bank material layer, or the time of a development process of patterning the bank layer BA, so that a portion of the bank material layer may remain in the step coverage region between the passivation layer PAS and the overcoat layer OC. For example, the step cover pattern BA_R may be formed by relatively reducing the soft baking process time or developing process time in comparison to a case where the step cover pattern is not formed. Also, the step cover pattern BA_R and the bank layer BA may be simultaneously formed through the same process. As illustrated in FIG. 9A, the step cover pattern BA_R may be formed in the form of a closed loop along the step coverage region between the passivation layer PAS and the overcoat layer OC.

The step cover pattern BA_R may be formed between the upper surface of the passivation layer PAS and the side surface of the overcoat layer OC in the step coverage region between the passivation layer PAS and the overcoat layer OC. The step cover pattern BA_R may be formed to have an inclined surface between the upper surface of the passivation layer PAS and the side surface of the overcoat layer OC. The inclined surface of the step cover pattern BA_R may expand an angle θ2 with the upper surface of the passivation layer PAS and an angle θ3 with the side surface of the overcoat layer OC, thereby gently completing the step coverage region between the overcoat layer OC and the passivation layer PAS.

In the light emitting display device 100 according to another embodiment of the present disclosure, since the step cover pattern BA_R is formed in the form of a closed loop along the step coverage region between the passivation layer PAS and the overcoat layer OC, the step coverage region between the overcoat layer OC and the passivation layer PAS may be completed gently, whereby it is possible to improve the coverage characteristic of the material to be deposited in the subsequent process.

Figure 10:
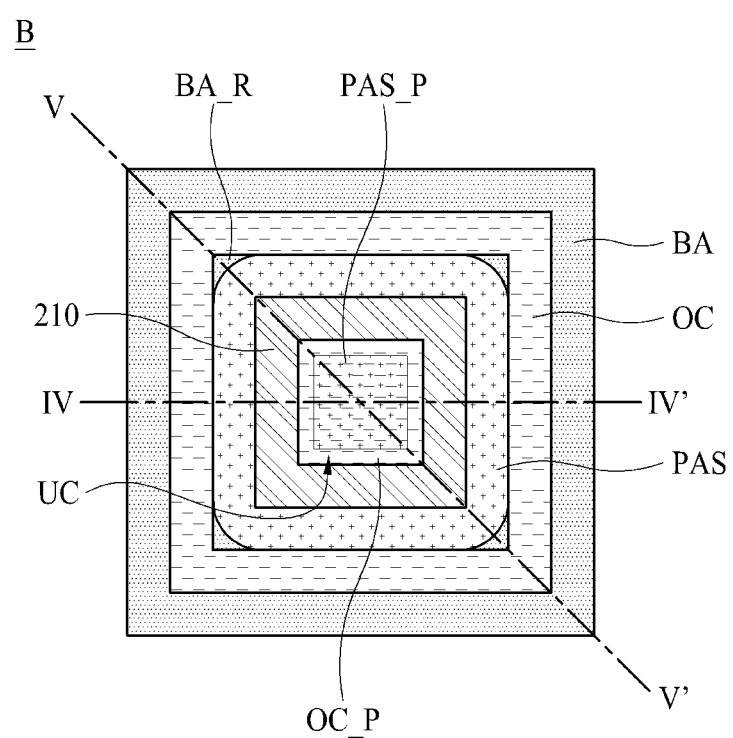
FIG. 10 is a plan view illustrating a contact area shown in 'B' of FIG. 7 according to another embodiment of the present disclosure.

FIG. 10 is a plan view illustrating a contact area shown in 'B' of FIG. 7 according to another embodiment of the present disclosure. In FIG. 10, a cross-sectional view along IV-IV' is substantially the same as that of FIG. 8B, and a cross-sectional view along V-V' is substantially the same as that of FIG. 9B, whereby it is not illustrated.

Referring to FIG. 10 in connection with FIGS. 7, 8B and 9B, a contact area of the light emitting display device 100 according to another embodiment of the present disclosure may include a contact portion CA which exposes a portion of an auxiliary power electrode 210. The contact portion CA may pass through a passivation layer PAS (or second protective layer), an overcoat layer OC (or first protective layer), and a bank layer BA to expose a portion of the auxiliary power electrode 210. An undercut structure OC_P and PAS_P including a first pattern OC_P (or eaves structure) and a second pattern PAS_P (or pillar structure) may be disposed on the auxiliary power electrode 210 exposed by the contact portion CA. In addition, a step cover pattern BA_R may be disposed at each inner edge in a step coverage region between the overcoat layer OC and the passivation layer PAS in the periphery of the contact portion CA. As described above, one or more side surfaces of the first pattern OC_P protrudes further than one or more side surfaces of the second pattern PAS_P to form the undercut structure. Differently, the undercut structure may have a first portion with a first width at a first distance from the auxiliary power electrode 210, and a second portion with a second width at a second distance from the auxiliary power electrode 210 smaller than the first distance, where the second width is smaller than the first width.

The light emitting display device 100 according to another embodiment of the present disclosure shown in FIG. 10 is substantially the same as the configuration of the light emitting display device 100 according to one embodiment of the present specification shown in FIGS. 8A and 8B, or the configuration of the light emitting display device 100 according to another embodiment of the present disclosure shown in FIGS. 9A and 9B except the arrangement structure of the step cover pattern BA_R in the corner of the step coverage region, whereby the same reference numerals will be used throughout the drawings to refer to the same components, and a redundant description thereof will be omitted or simplified.

As shown in FIG. 10, in the light emitting display device 100 according to another embodiment of the present disclosure, the step coverage region may be formed at each boundary of each layer in the form of step in which the passivation layer PAS, the overcoat layer OC, and the bank layer BA are disposed in the periphery of the auxiliary power electrode 210 exposed by the contact portion CA.

A step cover pattern BA_R may be disposed at each inner edge in the step coverage region between the passivation layer PAS and the overcoat layer OC. The step cover pattern BA_R may be formed of an organic insulating material. The step cover pattern BA_R may be formed of a material different from that of the passivation layer PAS and the overcoat layer OC. The step cover pattern BA_R may be formed of the same material as the bank layer BA disposed on the overcoat layer OC. The step cover pattern BA_R and the bank layer BA may be simultaneously formed through the same process.

The step cover pattern BA_R may be formed by depositing a bank material layer for the bank layer BA, and adjusting the time of a soft baking process in which heat treatment is performed on the deposited bank material layer, or the time of a development process of patterning the bank layer BA, so that a portion of the bank material layer may remain at each inner edge of the step coverage region between the passivation layer PAS and the overcoat layer OC. Also, the step cover pattern BA_R and the bank layer BA may be simultaneously formed through the same process. As illustrated in FIG. 10, the step cover pattern BA_R may be formed in the form of a closed loop at each inner edge of the step coverage region between the passivation layer PAS and the overcoat layer OC.

The step cover pattern BA_R may be formed at each inner corner portion in the step coverage region between the passivation layer PAS and the overcoat layer OC. The step cover pattern BA_R may be formed at an inner corner portion where adjacent inner surfaces of the overcoat layer OC meet. The inner corner at which the adjacent inner surfaces of the overcoat layer OC meet may act as a factor that further degrades the coverage characteristics of the material to be deposited in the subsequent process.

In the light emitting display device 100 according to another embodiment of the present disclosure, the step cover pattern BA_R is partially formed in each inner corner portion of the step coverage region between the passivation layer PAS and the overcoat layer OC, thereby improving the coverage characteristic of the material to be deposited in the subsequent process.

Meanwhile, in the light emitting display device 100 according to another embodiment of the present disclosure, the undercut structure OC_P and PAS_P may be formed on the auxiliary power electrode 210 exposed by the contact portion CA by using the overcoat layer OC and the passivation layer PAS having excellent adhesion characteristics, compared to the bank layer BA and the passivation layer PAS. The undercut structure OC_P and PAS_P may be formed to have an undercut region as a double layer of the first pattern OC_P and the second pattern PAS_P by patterning the overcoat layer OC on the passivation layer PAS to form an exposed region exposing a portion of the first pattern OC_P and a portion of the passivation layer PAS_P around the first pattern OC_P and carrying out a patterning process using a photoresist layer for covering the first pattern OC_P and a portion of the exposed region of the passivation layer PAS as a mask to form the first pattern OC_P and the second pattern PAS_P by removing a portion of the passivation layer PAS under the photoresist layer. However, the edge of the first pattern OC_P may be lifted upward in the patterning process for forming the second pattern PAS_P. As a result, additional securing of the undercut region may be required to increase the first pattern OC_P. This may act as a factor in which the patterning time and etching area of the undercut structure are increased.

Figure 11A:
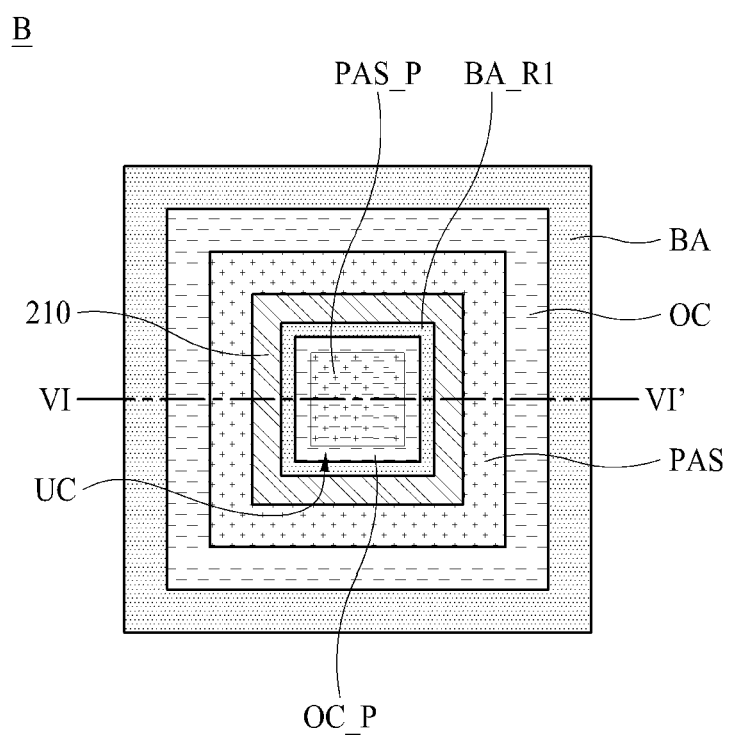
FIG. 11A is a plan view illustrating a contact area shown in 'B' of FIG. 7 according to another embodiment of the present disclosure.
Figure 11B:
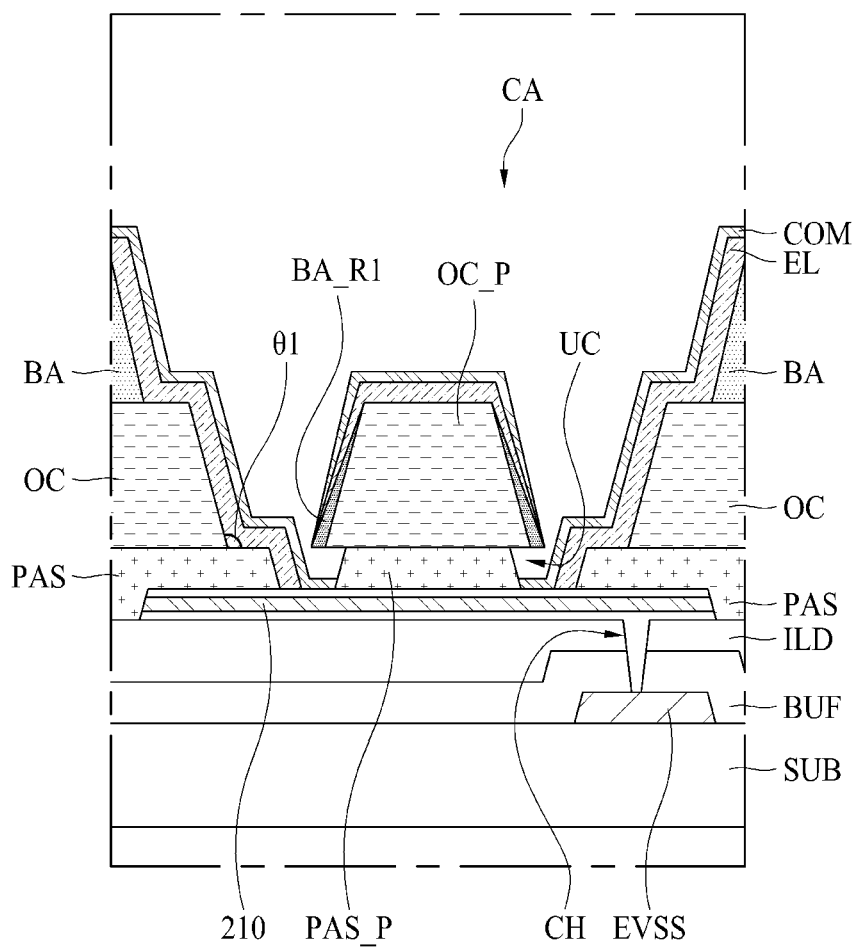
FIG. 11B is a cross sectional view along VI-VI' of FIG. 11A according to one embodiment of the present disclosure.

FIG. 11A is a plan view illustrating a contact area shown in 'B' of FIG. 7 according to another embodiment of the present disclosure. FIG. 11B is a cross sectional view along VI-VI' of FIG. 11A according to an embodiment of the present disclosure.

Referring to FIGS. 11A and 11B in connection with FIG. 7, a contact area of the light emitting display device 100 according to another embodiment of the present disclosure may include a contact portion CA which exposes a portion of an auxiliary power electrode 210. The contact portion CA may pass through a passivation layer PAS (or second protective layer), an overcoat layer OC (or first protective layer), and a bank layer BA to expose a portion of the auxiliary power electrode 210. An undercut structure OC_P, PAS_P and BA_R1 including a first pattern OC_P (or eaves structure), a second pattern PAS_P (or pillar structure) and an extension cover pattern BA_R1 disposed in a side surface of the first pattern OC_P may be disposed on the auxiliary power electrode 210 exposed by the contact portion CA.

The light emitting display device 100 according to another embodiment of the present disclosure shown in FIGS. 11A and 11B is substantially the same as the configuration of the light emitting display device 100 according to one embodiment of the present specification shown in FIGS. 8A and 8B except for the extension cover pattern BA_R1 included in the undercut structure OC_P, PAS_P and BA_R1, whereby the same reference numerals will be used throughout the drawings to refer to the same components, and a redundant description thereof will be omitted or simplified.

As shown in FIGS. 11A and 11B, the undercut structure OC_P, PAS_P and BA_R1 including the first pattern OC_P (or eaves structure), the second pattern PAS_P (or pillar structure) and the extension cover pattern BA_R1 disposed in the side surface of the first pattern OC_P may be disposed on the auxiliary power electrode 210 exposed by the contact portion CA in the light emitting display device 100 according to another embodiment of the present disclosure.

The undercut structure OC_P, PAS_P and BA_R1 may be disposed on a portion of the auxiliary power electrode 210 and may include an undercut region UC. The undercut structure OC_P, PAS_P and BA_R1 may be formed in an island pattern on a portion of the auxiliary power electrode 210, and an exposed portion of the auxiliary power electrode 210 may be formed in the periphery of the undercut structure OC_P, PAS_P and BA_R1. The auxiliary power electrode 210, which is exposed in the periphery of the undercut structure OC_P, PAS_P and BA_R1 in the contact portion CA, may be in contact with a common electrode COM (cathode electrode or second electrode) and may be electrically connected thereto. The undercut structures OC_P, PAS_P and BA_R1 may include a first pattern OC_P (or eaves structure) formed the same material as the overcoat layer OC and a second pattern PAS_P (or pillar structure) formed of the same material as the passivation layer PAS. As described above, one or more side surfaces of the first pattern OC_P protrudes further than one or more side surfaces of the second pattern PAS_P to form the undercut structure. Differently, the undercut structure may have a first portion with a first width at a first distance from the auxiliary power electrode 210, and a second portion with a second width at a second distance from the auxiliary power electrode 210 smaller than the first distance, where the second width is smaller than the first width. The extension cover pattern BA_R1 may be disposed in the side surface of the first pattern OC_P, wherein the extension cover pattern BA_R1 may be formed of the different material from that of the first pattern OC_P and the second pattern PAS_P. The extension cover pattern BA_R1 may be disposed in the edge portion of the first pattern OC_P. The extension cover pattern BA_R1 prevents the edge portion of the first pattern OC_P, which is the same material as the overcoat layer OC, from being lifted upward, and expands the undercut region UC. The extension cover pattern BA_R1 may be formed of the same material as the bank layer BA. In one embodiment, the extension cover pattern BA_R1 may have a first portion with a first width at a first distance from the auxiliary power electrode 210 and a second portion with a second width at a second distance smaller than the first distance from the auxiliary power electrode 210, where the second width is greater than the first width. The extension cover pattern BA_R1 and the bank layer BA may be simultaneously formed through the same process.

The extension cover pattern BA_R1 may be formed by depositing a bank material layer for the bank layer BA, and adjusting the time of a soft baking process in which heat treatment is performed on the deposited bank material layer, or the time of a development process of patterning the bank layer BA, so that a portion of the bank material layer may remain in the edge of the first pattern OC_P. For example, the extension cover pattern BA_R1 may be formed by relatively reducing the soft baking process time or developing process time in comparison to a case where the extension cover pattern BA_R1 is not formed. As illustrated in FIG. 11A, the extension cover pattern BA_R1 may be formed in the form of a closed loop along the edge of the first pattern OC_P.

The extension cover pattern BA_R1 may be disposed in the edge of the first pattern OC_P, wherein the extension cover pattern BA_R1 prevents the edge of the first pattern OC_P from being lifted and increases the width of the eaves structure of the undercut structure OC_P, PAS_P and BA_R1. The extension cover pattern BA_R1 may protrude from the side surface of the first pattern OC_P. The undercut region UC may be formed under the first pattern OC_P and the extension cover pattern BA_R1. The first pattern OC_P and the extension cover pattern BA_R1 may be disposed on the second pattern PAS_P, and may overlap a portion of the exposed auxiliary power electrode 210. The first pattern OC_P may be in direct contact with the upper surface of the second pattern PAS_P, and the extension cover pattern BA_R1 may not be in contact with the second pattern PAS_P.

The second pattern PAS_P may be formed on the upper surface of the auxiliary power electrode 210 and may be overlapped with the first pattern OC_P, to thereby support the first pattern OC_P. The second pattern PAS_P may not be in direct contact with the extension cover pattern BA_R1. The second pattern PAS_P may be formed in an island pattern on the auxiliary power electrode 210 and may include an upper surface which has a first width and is in contact with the first pattern OC_P, a lower surface which has a second width wider than the first width and is in contact with the auxiliary power electrode 210, and an inclined surface between the upper surface and the lower surface. In this case, the width of the lower surface of the first pattern OC_P and the extension cover pattern BA_R1 may be greater than the first width of the upper surface of the second pattern PAS_P. Also, the width of the first pattern OC_P and the extension cover pattern BA_R1 may be equal to or greater than the second width of the lower surface of the second pattern PAS_P. Since the lower surface of the first pattern OC_P and the extension cover pattern BA_R1 has a greater width than the upper surface of the second pattern PAS_P, the undercut region UC may be formed below the first pattern OC_P and the extension cover pattern BA_R1. The undercut region UC may include a portion under the first pattern OC_P and the extension cover pattern BA_R1 and a side surface of the second pattern PAS_P.

In the light emitting display device 100 according to another embodiment of the present disclosure, since a portion corresponding to the eaves structure in the undercut structure OC_P, PAS_P and BA_R1 is formed by the first pattern OC_P and the extension cover pattern BA_R1, it is possible to prevent the edge of the first pattern OC_P from being lifted. Thus, since the contact area between the common electrode COM and the auxiliary power electrode 210 may be secured without additional securing of the undercut region, the patterning time and etching area for patterning the second pattern PAS_P for exposing a portion of the auxiliary power electrode 210 may be reduced, thereby enabling high resolution and large size of the display device and reducing the process time and cost.

Figure 12A:
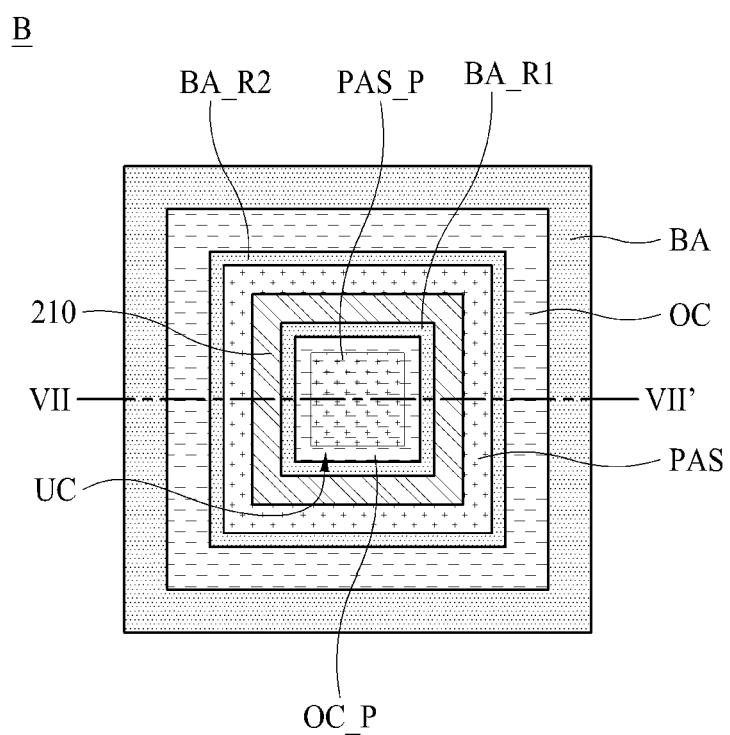
FIG. 12A is a plan view illustrating a contact area shown in 'B' of FIG. 7 according to another embodiment of the present disclosure.
Figure 12B:
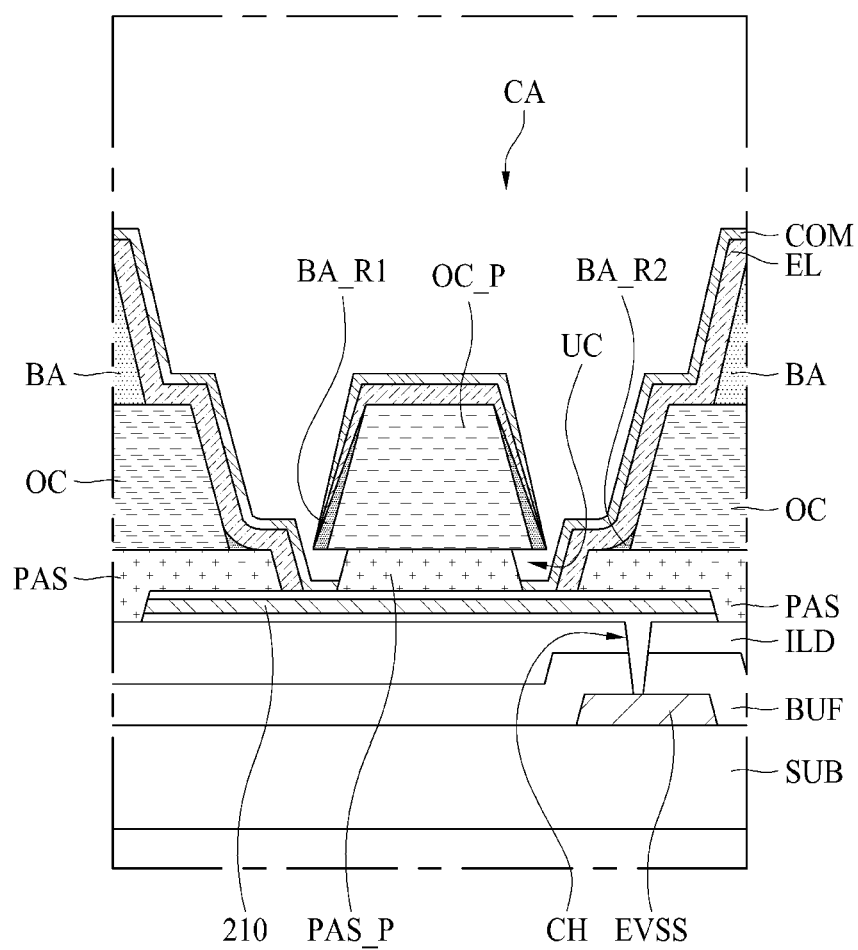
FIG. 12B is a cross sectional view along VII-VII' of FIG. 12A according to one embodiment of the present disclosure.

FIG. 12A is a plan view illustrating a contact area shown in 'B' of FIG. 7 according to another embodiment of the present disclosure. FIG. 12B is a cross sectional view along VII-VII' of FIG. 12A according to an embodiment of the present disclosure.

Referring to FIGS. 12A and 12B in connection with FIG. 7, a contact area of the light emitting display device 100 according to another embodiment of the present disclosure may include a contact portion CA which exposes a portion of an auxiliary power electrode 210. The contact portion CA may pass through a passivation layer PAS (or second protective layer), an overcoat layer OC (or first protective layer), and a bank layer BA to expose a portion of the auxiliary power electrode 210. An undercut structure OC_P, PAS_P and BA_R1 including a first pattern OC_P (or eaves structure), a second pattern PAS_P (or pillar structure) and an extension cover pattern BA_R1 disposed in a side surface of the first pattern OC_P may be disposed on the auxiliary power electrode 210 exposed by the contact portion CA. Also, a step cover pattern BA_R2 may be disposed in a step coverage region between the overcoat layer OC and the passivation layer PAS in the periphery of the contact portion CA.

The light emitting display device 100 according to another embodiment of the present disclosure shown in FIGS. 12A and 12B is substantially the same as the configuration of the light emitting display device 100 according to one embodiment of the present specification shown in FIGS. 11A and 11B except for the arrangement structure of the step cover pattern BA_R2 in the step coverage region, whereby the same reference numerals will be used throughout the drawings to refer to the same components, and a redundant description thereof will be omitted or simplified.

As shown in FIGS. 12A and 12B, the undercut structure OC_P, PAS_P and BA_R1 including the first pattern OC_P (or eaves structure), the second pattern PAS_P (or pillar structure) and the extension cover pattern BA_R1 disposed in the side surface of the first pattern OC_P may be disposed on the auxiliary power electrode 210 exposed by the contact portion CA in the light emitting display device 100 according to another embodiment of the present disclosure. Also, the step cover pattern BA_R2 may be disposed in the step coverage region between the passivation layer PAS and the overcoat layer OC. As described above, one or more side surfaces of the first pattern OC_P protrudes further than one or more side surfaces of the second pattern PAS_P to form the undercut structure. Differently, the undercut structure may have a first portion with a first width at a first distance from the auxiliary power electrode 210, and a second portion with a second width at a second distance from the auxiliary power electrode 210 smaller than the first distance, where the second width is smaller than the first width.

In the light emitting display device 100 according to another embodiment of the present disclosure, the extension cover pattern BA_R1 of the undercut structure OC_P, PAS_P and BA_R1 and the step cover pattern BA_R2 of the step coverage region may be formed of the same material.

The extension cover pattern BA_R1 and the step cover pattern BA_R2 may be formed of the same material as the bank layer BA. The extension cover pattern BA_R1 and the step cover pattern BA_R2 may be simultaneously formed through the same process as that of the bank layer BA.

The extension cover pattern BA_R1 and the step cover pattern BA_R2 may be formed by depositing a bank material layer for the bank layer BA, and adjusting the time of a soft baking process in which heat treatment is performed on the deposited bank material layer, or the time of a development process of patterning the bank layer BA, so that a portion of the bank material layer may remain in the step coverage region between the passivation layer PAS and the overcoat layer OC and the edge portion of the first pattern OC_P. For example, the extension cover pattern BA_R1 and the step cover pattern BA_R2 may be formed by relatively reducing the soft baking process time or developing process time in comparison to a case where the cover patterns are not formed. As illustrated in FIG. 12A, the extension cover pattern BA_R1 may be formed in the form of a closed loop along the periphery of the first pattern OC_P, and the step cover pattern BA_R2 may be formed in the form of a closed loop along the step coverage region between the passivation layer PAS and the overcoat layer OC.

In the light emitting display device 100 according to another embodiment of the present disclosure, since a portion corresponding to the eaves structure in the undercut structure OC_P, PAS_P and BA_R1 is formed by the first pattern OC_P and the extension cover pattern BA_R1, it is possible to prevent the edge of the first pattern OC_P from being lifted. Thus, since the contact area between the common electrode COM and the auxiliary power electrode 210 may be secured without additional securing of the undercut region, the patterning time and etching area for patterning the second pattern PAS_P for exposing a portion of the auxiliary power electrode 210 may be reduced, thereby enabling high resolution and large size of the display device and reducing the process time and cost.

Also, in the light emitting display device 100 according to another embodiment of the present disclosure, since the step cover pattern BA_R2 is formed in the form of a closed loop along the step coverage region between the passivation layer PAS and the overcoat layer OC, the step coverage region between the overcoat layer OC and the passivation layer PAS may be completed gently, whereby it is possible to improve the coverage characteristic of the material to be deposited in the subsequent process.

Figure 13:
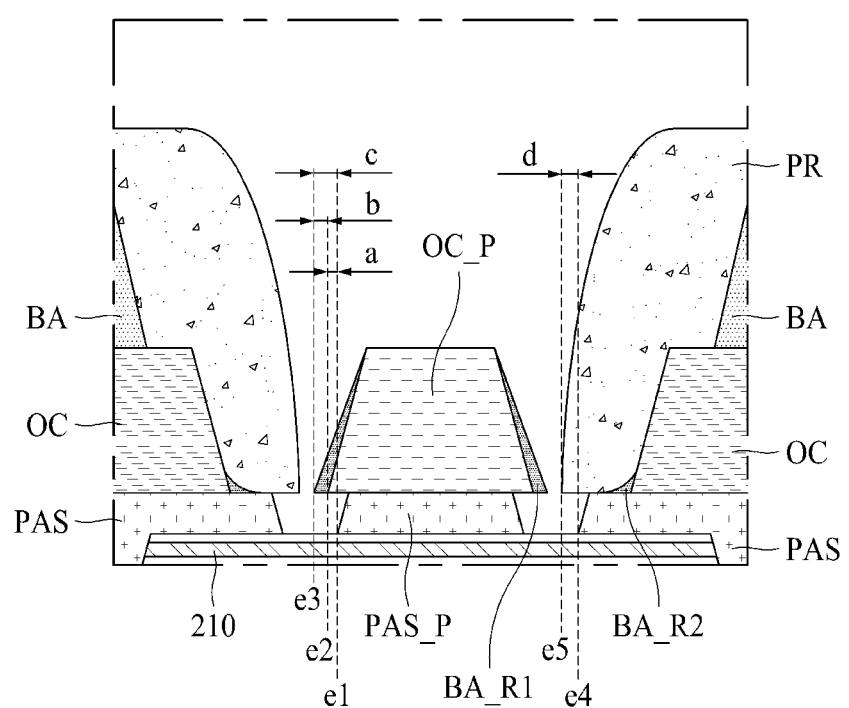
FIG. 13 illustrates a method of forming an undercut structure according to another embodiment of the present disclosure.

FIG. 13 illustrates a method of forming the undercut structure according to another embodiment of the present disclosure.

Referring to FIG. 13, in the undercut structure OC_P, PAS_P and BA_R1 according to another embodiment of the present disclosure, an end portion e1 of the second pattern PAS_P is additionally removed by a first length (a) in an inward direction than an end portion e2 of the first pattern OC_P, so that the undercut region may be formed under the first pattern OC_P. In the undercut structure OC_P, PAS_P and BA_R1, the extension cover pattern BA_R1 may be formed in the side surface of the first pattern OC_P. The extension cover pattern BA_R1 may have an end portion e3 protruding from the end portion e2 of the first pattern OC_P by a second length (b). Accordingly, the undercut structure OC_P, PAS_P and BA_R1 may have an undercut region having a third length (c) obtained by adding the first length (a) and the second length (b) under the first pattern OC_P and the extension cover pattern BA_R1.

Also, the second pattern PAS_P of the undercut structure OC_P, PAS_P and BA_R1 may be formed by a patterning process using a photoresist layer PR for covering the first pattern OC_P, and covering the passivation layer PAS, the overcoat layer OC and the bank layer BA in the periphery of the first pattern OC_P as a mask. The patterning process of the second pattern PAS_P may use a wet etching process. Through the wet etching process, the passivation layer PAS may be patterned to form the contact area exposing the auxiliary power electrode 210. An end portion e4 of the patterned passivation layer PAS may be removed by a fourth length (d) in an inward direction than an end portion e5 of the photoresist layer PR. In this case, in the case of wet etching, the selected area may be removed isotropically, and the etching length (d) (or fourth length) of the passivation layer PAS may be approximately similar to the length (c) (or third length) of the undercut region.

The light emitting display device according to the embodiment of the present disclosure may be described as follows.

The light emitting display device according to an embodiment of the present disclosure may include a circuit layer having an auxiliary power electrode disposed on a substrate, a first protective layer covering the circuit layer, a second protective layer disposed between the first protective layer and the auxiliary power electrode, a contact portion penetrating the first protective layer and the second protective layer to expose a portion of the auxiliary power electrode, and a step cover pattern disposed in a step coverage region between the first protective layer and the second protective layer in the periphery of the contact portion.

In the light emitting display device according to an embodiment of the present disclosure, the step cover pattern may be formed between an upper surface of the second protective layer and a side surface of the first protective layer.

In the light emitting display device according to an embodiment of the present disclosure, the step cover pattern may be formed to have an inclined surface between an upper surface of the second protective layer and a side surface of the first protective layer.

In the light emitting display device according to an embodiment of the present disclosure, the inclined surface of the step cover pattern may have an obtuse angle with respect to the inclined surface of the first protective layer and also may have an obtuse angle with respect to the upper surface of the second protective layer.

In the light emitting display device according to an embodiment of the present disclosure, may further include an undercut structure disposed on a portion of the auxiliary power electrode in the contact portion and configured to have an undercut region.

In the light emitting display device according to an embodiment of the present disclosure, the undercut structure may include a first pattern disposed on a portion of the auxiliary power electrode, a second pattern disposed on the upper surface of the auxiliary power electrode and configured to support the first pattern, and a dummy electrode pattern disposed between the first pattern and the second pattern, the step cover pattern may be formed of the same material as the first pattern.

In the light emitting display device according to an embodiment of the present disclosure, the first pattern may be formed of the different material from that of the first protective layer, and the second pattern may be formed of the same material as the second protective layer.

In the light emitting display device according to an embodiment of the present disclosure, the step cover pattern may be formed to cover metal foreign matter which is the same as that of the dummy electrode pattern.

In the light emitting display device according to an embodiment of the present disclosure, the undercut structure may include a first pattern disposed on a portion of the auxiliary power electrode, and a second pattern disposed on the upper surface of the auxiliary power electrode and configured to support the first pattern, the step cover pattern may include a material different from the first pattern.

In the light emitting display device according to an embodiment of the present disclosure, the first pattern may be formed of the same material as the first protective layer, and the second pattern may be formed of the same material as the second protective layer.

In the light emitting display device according to an embodiment of the present disclosure, may further include a thin film transistor disposed on the circuit layer of the substrate, a pixel electrode disposed on the first protective layer and connected to the thin film transistor, and a bank layer disposed on the first protective layer and configured to define an opening on the pixel electrode.

In the light emitting display device according to an embodiment of the present disclosure, the step cover pattern may be formed of the same material as the bank layer.

In the light emitting display device according to an embodiment of the present disclosure, may further include an undercut structure disposed on a portion of the auxiliary power electrode in the contact portion and configured to have an undercut region, the undercut structure may include a first pattern disposed on a portion of the auxiliary power electrode, a second pattern disposed on the upper surface of the auxiliary power electrode and configured to support the first pattern, and a dummy electrode pattern disposed between the first pattern and the second pattern, the dummy electrode pattern may be formed of the same material as the pixel electrode.

In the light emitting display device according to an embodiment of the present disclosure, may further include a light emitting layer disposed on the pixel electrode, and a common electrode disposed on the light emitting layer, the common electrode may directly contact the auxiliary power electrode in the undercut region.

In the light emitting display device according to an embodiment of the present disclosure, the step cover pattern may be formed in the form of a closed loop along the step coverage region between the first protective layer and the second protective layer.

In the light emitting display device according to an embodiment of the present disclosure, the step cover pattern may be formed at each inner corner in the step coverage region between the first protective layer and the second protective layer.

The light emitting display device according to an embodiment of the present disclosure may include a circuit layer having a thin film transistor and an auxiliary power electrode disposed on a substrate, a first protective layer covering the circuit layer, a second protective layer disposed between the first protective layer and the auxiliary power electrode, a pixel electrode disposed on the first protective layer and connected to the thin film transistor, a bank layer disposed on the first protective layer and configured to define an opening on the pixel electrode, a contact portion passing through the first and second protective layers and the bank layer to expose a portion of the auxiliary power electrode, a light emitting layer disposed on the pixel electrode and the bank layer, a common electrode disposed on the light emitting layer and connected to the auxiliary power electrode in the contact portion, and a step cover pattern disposed in a step coverage region between the first protective layer and the second protective layer in the periphery of the contact portion.

In the light emitting display device according to an embodiment of the present disclosure, the step cover pattern may be formed of the same material as the bank layer.

In the light emitting display device according to an embodiment of the present disclosure, may further include an undercut structure disposed on a portion of the auxiliary power electrode in the contact portion and configured to have an undercut region, the undercut structure may include a first pattern disposed on a portion of the auxiliary power electrode, a second pattern disposed on an upper surface of the auxiliary power electrode and configured to support the first pattern, and a dummy electrode pattern disposed between the first pattern and the second pattern, the first pattern may be formed of the same material as the bank layer, the second pattern may be formed of the same material as the second protective layer, and the dummy electrode pattern may be formed of the same material as the pixel electrode.

In the light emitting display device according to an embodiment of the present disclosure, the step cover pattern may be formed to cover metal foreign matter which is the same as that of the dummy electrode pattern.

In the light emitting display device according to an embodiment of the present disclosure, may further include an undercut structure disposed on a portion of the auxiliary power electrode in the contact portion and configured to have an undercut region, the undercut structure may include a first pattern disposed on a portion of the auxiliary power electrode and formed of the same material as the first protective layer, a second pattern disposed on an upper surface of the auxiliary power electrode, formed of the same material as the second protective layer and configured to support the first pattern, and an extension cover pattern disposed on a side surface of the first pattern and formed of the same material as the step cover pattern.

The light emitting display device according to an embodiment of the present disclosure may include a circuit layer having an auxiliary power electrode disposed on a substrate, a first protective layer covering the circuit layer, a second protective layer disposed between the first protective layer and the auxiliary power electrode, a contact portion penetrating the first protective layer and the second protective layer to expose a portion of the auxiliary power electrode, an eaves structure disposed on a portion of the auxiliary power electrode, and an extension cover pattern on a side surface of the eaves structure.

In the light emitting display device according to an embodiment of the present disclosure, the eaves structure may be formed of the same material as the first protective layer, and the extension cover pattern may be formed of the different material from that of the eaves structure.

In the light emitting display device according to an embodiment of the present disclosure, the eaves structure may be supported by a pillar structure disposed between the upper surface of the auxiliary power electrode and the lower surface of the eaves structure, and the pillar structure may be formed of the same material as the second protective layer.

In the light emitting display device according to an embodiment of the present disclosure, may further include an undercut region disposed below the eaves structure and the extension cover pattern and disposed on the side surface of the pillar structure.

In the light emitting display device according to an embodiment of the present disclosure, may further include a thin film transistor disposed on the circuit layer of the substrate, a pixel electrode disposed on the first protective layer and connected to the thin film transistor, and a bank layer disposed on the first protective layer and configured to define an opening on the pixel electrode, the extension cover pattern may be formed of the same material as the bank layer.

In the light emitting display device according to an embodiment of the present disclosure, may further include a step cover pattern disposed in a step coverage region between the first protective layer and the second protective layer in the periphery of the contact portion, the step cover pattern may be formed of the same material as the extension cover pattern.

In the light emitting display device according to the present disclosure, the cover pattern is provided to cover the step coverage region between the different material layers in the periphery of the contact area in the cathode contact structure, so that it is possible to improve the coverage characteristic of the material deposited in the subsequent process, and to prevent the diffusion of the defect through the cover of the metal foreign matters, thereby improving the reliability of the device.

Also, in the light emitting display device according to the present disclosure, the undercut structure is formed by using the overcoat layer and the passivation layer having excellent adhesion characteristics in the cathode contact structure, and the cover pattern is formed in the edge of the pattern of the overcoat layer corresponding to the eaves structure of the undercut structure, so that the patterning time and etching area of the undercut structure may be reduced, thereby reducing the process time and cost and enabling the display device with the high resolution and the large area.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A light emitting display device comprising:
   a substrate;
   at least one subpixel on the substrate, the subpixel including a light emitting element;
   an auxiliary power electrode disposed on the substrate, the auxiliary power electrode electrically connected to a common electrode of the light emitting element;
   a first protective layer on the substrate;
   a second protective layer disposed between the first protective layer and the auxiliary power electrode, wherein one or more openings are formed through the first protective layer and the second protective layer to expose a portion of the auxiliary power electrode to form a contact region for connecting the common electrode;
   a structure disposed on the exposed portion of the auxiliary power electrode in the contact region; and
   a cover pattern disposed in a coverage region in the contact region, wherein the coverage region is located where an upper surface of the second protective layer and a side surface of the first protective layer intersect in the contact region,
   wherein the cover pattern is formed to have an inclined surface between the upper surface of the second protective layer and the side surface of the first protective layer, and
   wherein the inclined surface include a first end terminating at the side surface of the first protective layer and a second end terminating at the upper surface of the second protective layer.

2. The light emitting display device according to claim 1, wherein the cover pattern has an obtuse angle at the first end with respect to the side surface of the first protective layer and an obtuse angle at the second end with respect to the upper surface of the second protective layer.

3. The light emitting display device according to claim 1, wherein the structure includes:
   a first pattern disposed on the auxiliary power electrode in the contact region;
   a second pattern disposed on the exposed portion of the auxiliary power electrode and under the first pattern,
   wherein a side surface of the first pattern protrudes further than a side surface of the second pattern to form an undercut region.

4. The light emitting display device according to claim 3, further comprising a bank layer on the first protective layer and disposed on at least a portion of a pixel electrode of the light emitting element,
   wherein the first pattern is formed of a same material as the bank layer and the second pattern is formed of a same material as the second protective layer.

5. The light emitting display device according to claim 3, wherein the first pattern is formed of a same material as the first protective layer and the second pattern is formed of a same material as the second protective layer.

6. The light emitting display device according to claim 3, a dummy electrode pattern disposed between the first pattern and the second pattern.

7. The light emitting display device according to claim 6, wherein the cover pattern comprises a metal material on the coverage region formed of a same material as the dummy electrode pattern.

8. The light emitting display device according to claim 7, wherein the light emitting element includes a pixel electrode, and the metal material is formed of the same material as the pixel electrode and the dummy electrode pattern.

9. The light emitting display device according to claim 1, wherein the structure includes:
   a first pattern disposed on the substrate in the contact region; and
   a second pattern disposed on the exposed portion of the auxiliary power electrode and under the first pattern,
   wherein the cover pattern includes a material different from the first pattern.

10. The light emitting display device according to claim 1, further comprising:
    a thin film transistor disposed on the substrate;
    a pixel electrode disposed on the first protective layer and electrically connected to the thin film transistor; and
    a bank layer disposed on the first protective layer and disposed on at least a portion of the pixel electrode.

11. The light emitting display device according to claim 10, wherein the cover pattern is formed of a same material as the bank layer.

12. The light emitting display device according to claim 1,
    wherein the structure includes a first portion with a first width at a first distance from the auxiliary power electrode and a second portion with a second width smaller than the first width at a second distance from the auxiliary power electrode smaller than the first distance, and
    wherein the common electrode directly contacts the exposed portion of the auxiliary power electrode in a region under the first portion of the structure.

13. The light emitting display device according to claim 1, wherein the cover pattern is formed along the coverage region in a loop shape.

14. The light emitting display device according to claim 1, wherein the cover pattern is formed at an inner corner region in the coverage region where the upper surface of the second protective layer intersects with the side surface of the first protective layer and another side surface of the first protective layer.

15. The light emitting display device according to claim 1, further comprising:
    an extension cover pattern disposed on a side surface of the structure in the contact region and formed of a same material as the cover pattern.

16. A light emitting display device comprising:
    a substrate;
    at least one subpixel on the substrate, the subpixel including a light emitting element;
    an auxiliary power electrode disposed on the substrate, the auxiliary power electrode electrically connected to a common electrode of the light emitting element;
    a first protective layer on the substrate;
    a second protective layer disposed between the first protective layer and the auxiliary power electrode, wherein one or more openings are formed through the first protective layer and the second protective layer to expose a portion of the auxiliary power electrode to form a contact region for connecting the common electrode;
    a structure disposed on the exposed portion of the auxiliary power electrode in the contact region;
    an extension cover pattern on a side surface of the structure; and a cover pattern disposed in a coverage region in the contact region, wherein the coverage region is located where an upper surface of the second protective layer and a side surface of the first protective layer intersect in the contact region, wherein the cover pattern is formed to have an inclined surface between the upper surface of the second protective layer and the side surface of the first protective layer, and wherein the inclined surface include a first end terminating at the side surface of the first protective layer and a second end terminating at the upper surface of the second protective layer.

17. The light emitting display device according to claim 16, wherein a portion of the structure is formed of a same material as the first protective layer, and the extension cover pattern is formed of a different material from the portion of the structure.

18. The light emitting display device according to claim 16, wherein the structure includes:

a first pattern on the substrate in the contact region;

a second pattern on the exposed portion of the auxiliary power electrode and under the first pattern, and wherein the second pattern is formed of a same material as the second protective layer.

19. The light emitting display device according to claim 18, wherein a side surface of the first pattern protrudes further than a side surface of the second pattern to form an undercut region, and wherein the extension cover pattern is disposed on the side surface of the first pattern.

20. The light emitting display device according to claim 16, further comprising:

a thin film transistor disposed on of the substrate;

a pixel electrode disposed on the first protective layer and electrically connected to the thin film transistor; and a bank layer disposed on the first protective layer and disposed on at least a portion of the pixel electrode, wherein the extension cover pattern is formed of a same material as the bank layer.

21. The light emitting display device according to claim 16, wherein the extension cover pattern includes a first portion having a first width at a first distance from the auxiliary power electrode and a second portion having a second width at a second distance from the auxiliary power electrode, the second distance is smaller than the first distance and the second width greater than the first width.

* * * * *